United States Patent
Asayama

(10) Patent No.: US 8,391,093 B2
(45) Date of Patent: Mar. 5, 2013

(54) SEMICONDUCTOR MEMORY DEVICE INCLUDING SRAM CELL

(75) Inventor: Shinobu Asayama, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 159 days.

(21) Appl. No.: 13/064,537

(22) Filed: Mar. 30, 2011

(65) Prior Publication Data

US 2011/0242882 A1    Oct. 6, 2011

(30) Foreign Application Priority Data

Mar. 31, 2010    (JP) .................................. 2010-083339

(51) Int. Cl.
*G11C 7/02*    (2006.01)

(52) U.S. Cl. ...................... 365/210.1; 365/51; 365/154

(58) Field of Classification Search ............... 365/51, 365/154, 210.1
See application file for complete search history.

(56) References Cited

U.S. PATENT DOCUMENTS

| | | | |
|---|---|---|---|
| 5,089,992 A * | 2/1992 | Shinohara | 365/51 |
| 5,379,246 A * | 1/1995 | Nogami | 365/51 |
| 5,463,576 A * | 10/1995 | Kuriyama et al. | 365/63 |
| 5,757,689 A | 5/1998 | Seno | |
| 5,930,163 A | 7/1999 | Hara et al. | |
| 6,717,842 B2 * | 4/2004 | Watanabe et al. | 365/154 |
| 6,894,943 B2 * | 5/2005 | Suzuki et al. | 365/230.03 |
| 6,996,020 B2 * | 2/2006 | Yoshida | 365/230.03 |
| 7,791,971 B2 * | 9/2010 | Tohata et al. | 365/230.03 |
| 7,804,717 B2 * | 9/2010 | Hanzawa et al. | 365/185.2 |

FOREIGN PATENT DOCUMENTS

| | | |
|---|---|---|
| JP | 8-167291 A | 6/1996 |
| JP | 3523762 B2 | 2/2004 |

* cited by examiner

*Primary Examiner* — VanThu Nguyen
(74) *Attorney, Agent, or Firm* — McGinn IP Law Group, PLLC

(57) ABSTRACT

A semiconductor memory device includes: a first word line and a second word line; a plurality of first SRAM cells; a plurality of second SRAM cells; and a mediating cell. Each first SRAM cell includes the first word line and the second word line and is connected to the first word line. Each second SRAM cell includes the first word line and the second word line and is connected to the second word line. The mediating cell is arranged between and adjacent to one first SRAM cell and one second SRAM cell and is connected to the first word line and the second word line. In the mediating cell and the plurality of first SRAM cells, cells adjacent to each other share a contact for the first word line. In the mediating cell and the plurality of second SRAM cells, cells adjacent to each other share a contact for the second word line.

16 Claims, 24 Drawing Sheets

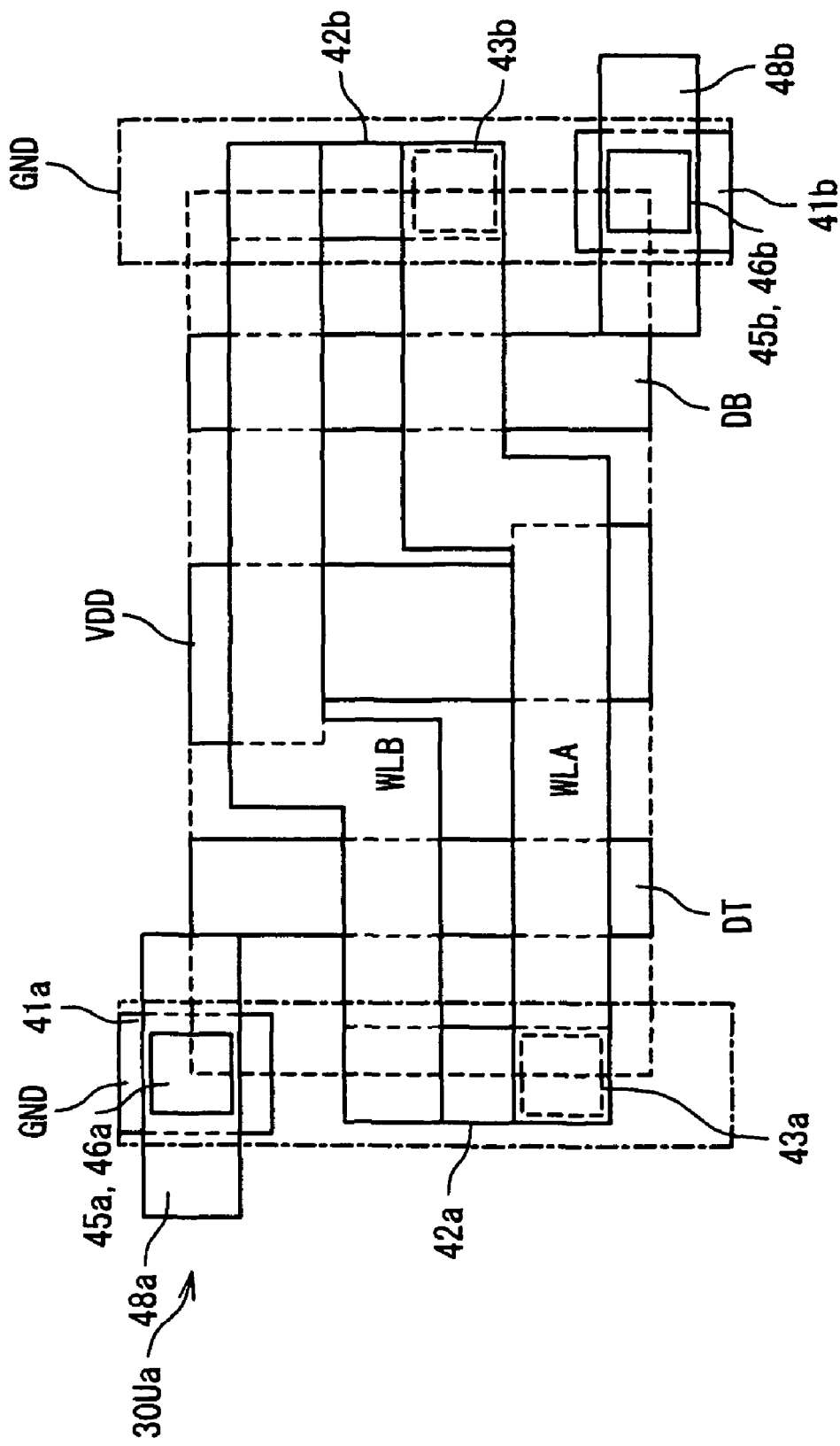

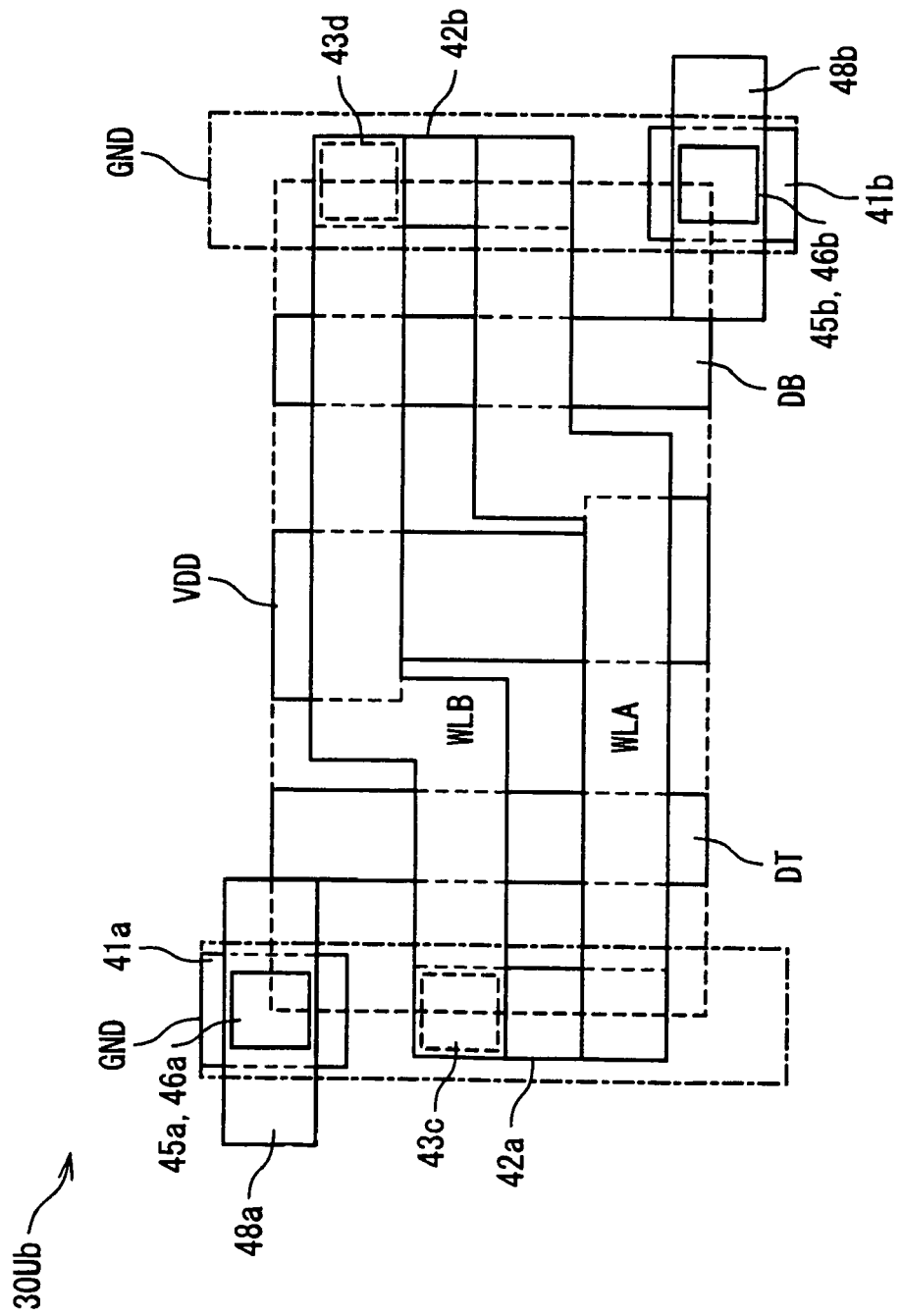

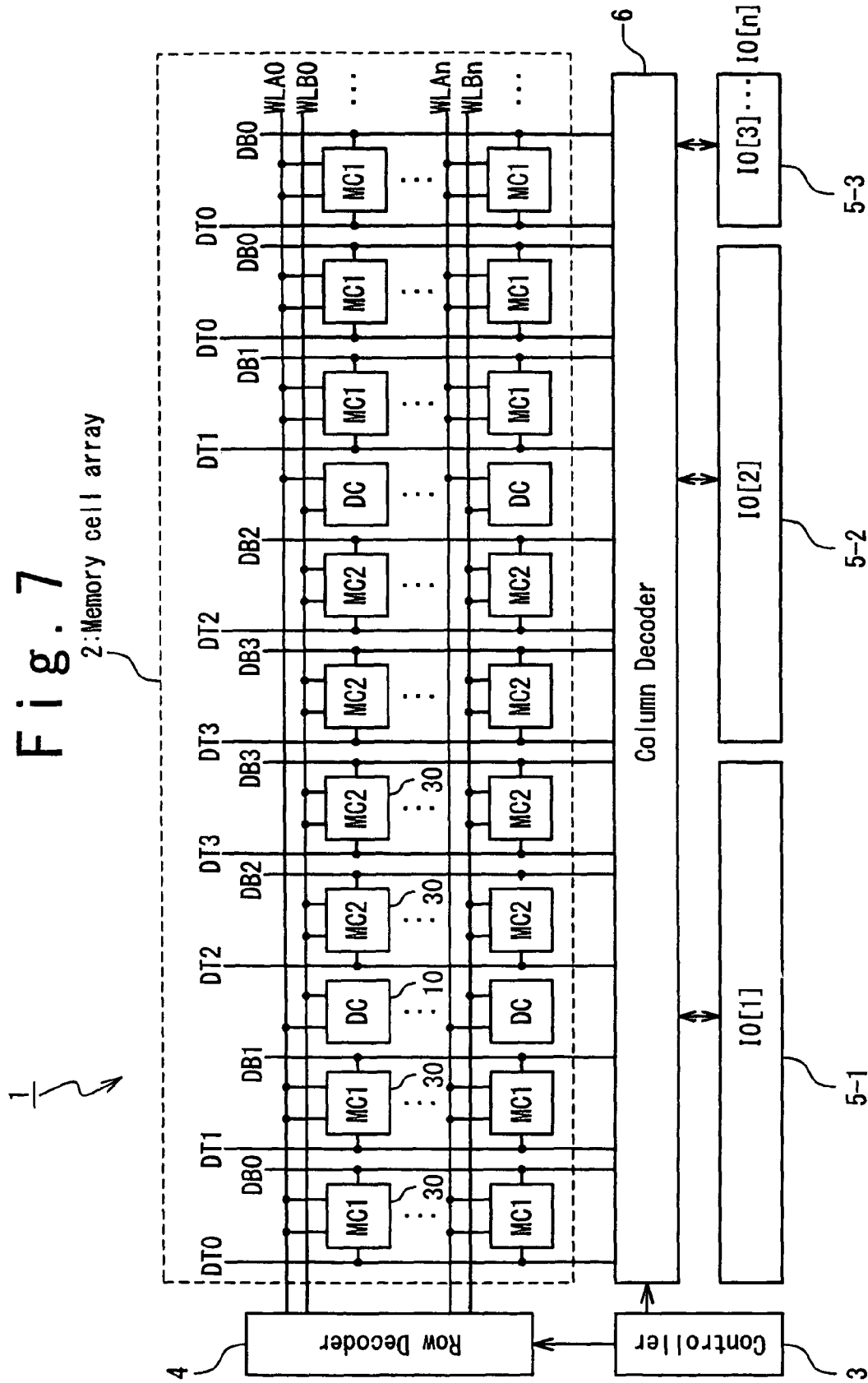

Fig. 8A

| Row | | | | | |
|---|---|---|---|---|---|
| | WLA0 | 1 | 2 | NA | NA |
| | WLB0 | NA | NA | 3 | 4 |
| | WLB1 | NA | NA | 7 | 8 |
| | WLA1 | 5 | 6 | NA | NA |
| | WLA2 | 9 | 10 | NA | NA |
| | WLB2 | NA | NA | 11 | 12 |
| | ⋮ | ⋮ | ⋮ | ⋮ | ⋮ |
| | | C0 | C1 | C2 | C3 |
| | | 4column | | | |

Fig. 8B

| ADDRESS | Column | Row |
|---|---|---|
| 1 | C0 | WLA0 |
| 2 | C1 | WLA0 |
| 3 | C2 | WLB0 |
| 4 | C3 | WLB0 |
| 5 | C0 | WLA1 |
| 6 | C1 | WLA1 |
| 7 | C2 | WLB1 |
| 8 | C3 | WLB1 |
| 9 | C0 | WLA2 |
| 10 | C1 | WLA2 |
| 11 | C2 | WLB2 |
| 12 | C3 | WLB2 |
| ⋮ | ⋮ | ⋮ |

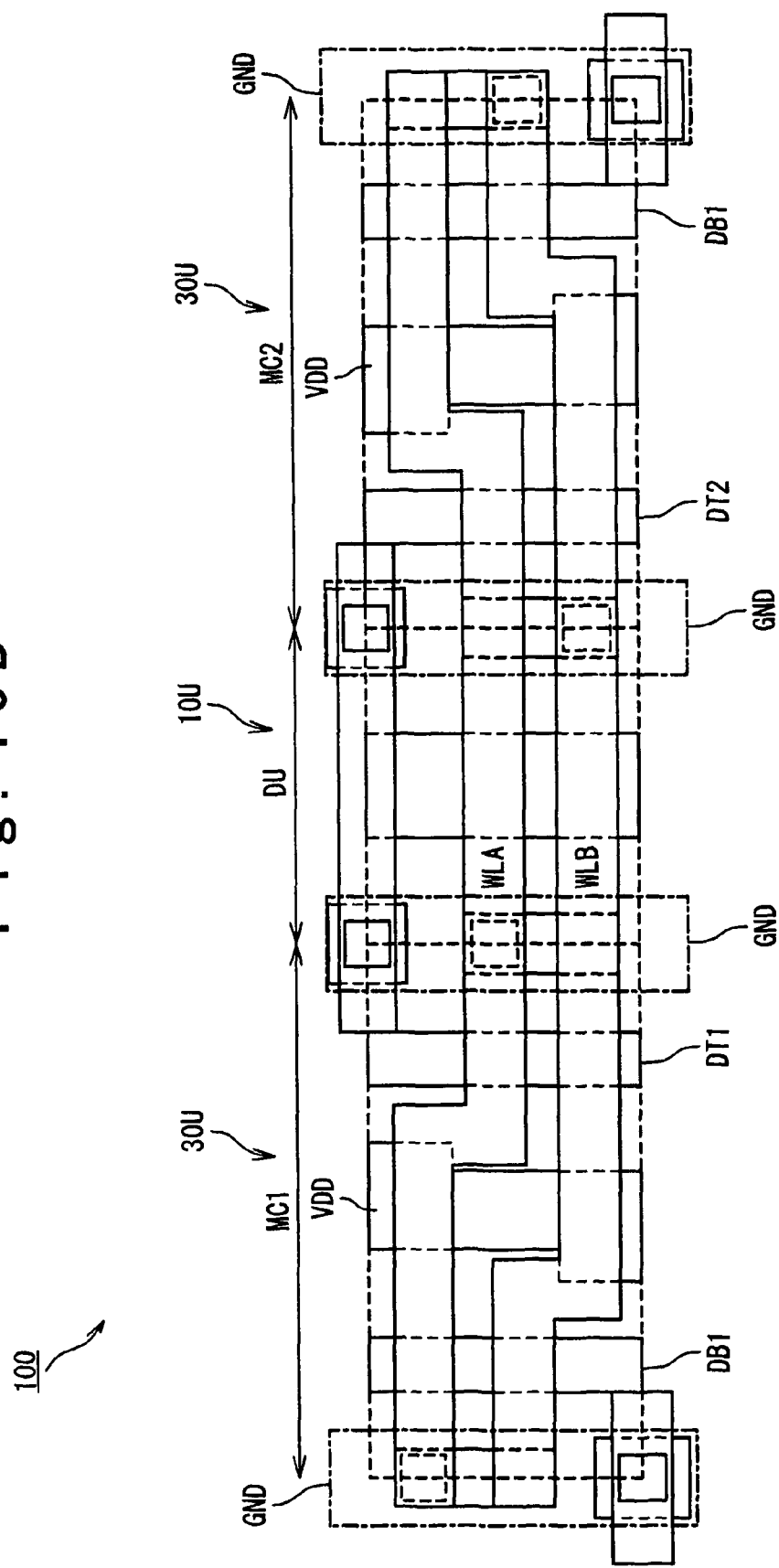

SEMICONDUCTOR MEMORY DEVICE INCLUDING SRAM CELL

INCORPORATION BY REFERENCE

This application is based upon and claims the benefit of priority from Japanese patent application No. 2010-083339 filed on Mar. 31, 2010, the disclosure of which is incorporated herein in its entirety by reference.

BACKGROUND

1. Field of the Invention

The present invention relates to a semiconductor memory device, and more particularly relates to a semiconductor memory device including an SRAM (Static Random access Memory) cell.

2. Description of Related Art

An SRAM is known as a memory able to operate at a high speed. In the SRAM, when a word line is activated, all memory cells, which include a target memory cell and are connected to the word line, are activated. For this reason, the charging and discharging are carried out not only to a bit line pair of the target memory cell but also to bit line pairs of non-target memory cells. The charging and discharging carried out to the bit line pairs of the non-target memory cells cause unnecessary power consumption.

As a technique for reducing power consumption in an SRAM, a semiconductor memory device is disclosed in JP-A-Heisei 8-167291 (Patent literature 1, corresponding to U.S. Pat. No. 5,757,689(A)). FIG. 1 directly shows FIG. 1 of JP-A-Heisei 8-167291 without changing reference numerals, symbols and the like (accordingly, the reference numerals, symbols and the like are valid only in FIG. 1 and do not relate to reference numerals, symbols and the like of an embodiment of the present invention described below). The semiconductor memory device includes a memory cell array where a plurality of memory cells (M00, M01, ..., M10, M11, ...) are arranged in a matrix shape, thus activates addressed word lines (EWL0, OWL0, ...) to operatively connect the memory cells (M00, M01, ...) to bit lines (B0, /B0, B1, /B1, ...), and then lets data be sent and received. The semiconductor memory device includes at least two word lines (for example, EWL0 and OWL0) to the same row address, the word lines being controlled by a column address. The memory cells (for example, M00, M01, ...) belonging to the same row (for example, 0th row) have the same row address, and are connected to the different word line (for example, EWL0 or OWL0) of the above-mentioned at least two word lines (for example, EWL0 and OWL0) having different column addresses. That is, in the semiconductor memory, the number of bit line pairs to be charged and discharged is reduced by using a plurality of word lines, and thus the number of times of unnecessary charging and discharging is reduced. In this manner, the power consumption is reduced.

Meanwhile, after the technology node 90 nm, in an SRAM, a horizontal memory cell layout has been often employed. As a technique of a horizontal memory cell layout, a semiconductor memory device is disclosed in JP 3523762(B2) (Patent literature 2, corresponding to U.S. Pat. No. 5,930,163(A)). FIGS. 2A, 2B, and 2C directly show FIGS. 1, 2, and 16 of JP 3523762 (B2), respectively, without changing reference numerals, symbols and the like, (accordingly, the reference numerals, symbols and the like are valid only in FIGS. 2A, 2B, and 2C, and do not relate to reference numerals, symbols and the like of the embodiment of the present invention described below). The semiconductor memory device includes a first inverter, a second inverter, a third N-channel type MOS transistor (N3), and a fourth N-channel type MOS transistor (N4). The first inverter includes a first N-channel type MOS transistor (N1) and a first P-channel type MOS transistor (P1). The second inverter includes a second N-channel type MOS transistor (N2) and a second P-channel type MOS transistor (P2). An input terminal of the second inverter is connected to an output terminal of the first inverter, and an output terminal of the second inverter is connected to an input terminal of the first inverter. In the third N-channel type MOS transistor (N3), the source is connected to the output terminal of the first inverter, the drain is connected to a first bit line (BL), and the gate is connected to a word line (WL). In the fourth N-channel type MOS transistor (N4), the source is connected to the output terminal of the second inverter, the drain is connected to a second bit line (/BL), and the gate is connected to the word line (WL). Respective arrangement directions of source and drain of: the first, second, third, and fourth N-channel type MOS transistors (N1, N2, N3, and N4); and the first and second P-channel type MOS transistors (P1 and P2) are configured so as to be parallel to a boundary line between: a P-well region (P well) where the first, second, third, and fourth N-channel type MOS transistors (N1, N2, N3, and N4) are formed; and an N-well region (N well) where the first and second P-channel type MOS transistors are formed. A first polycrystalline silicon wiring layer (PL2) used for the gate of the third N-channel type MOS transistor (N3) and a second polycrystalline silicon wiring layer (PL1) used for the gate of the first N-channel type MOS transistor (N1) and for the gate of the first P-channel type MOS transistor (P1) are arranged in parallel to each other. A third polycrystalline silicon wiring layer (PL4) used for the gate of the fourth N-channel type MOS transistor (N4) and a fourth polycrystalline silicon wiring layer (PL3) used for the gate of the second N-channel type MOS transistor (PL3) and for the gate of the second P-channel type MOS transistor (P2) are arranged in parallel to each other.

The inventor has now discovered the following facts. As described above, in the horizontal memory cell layout (FIGS. 2A and 2B), the SRAM cell has a structure that sandwiches the N-well with the P-wells. Then, the load transistors (P1 and P2) are arranged in the center of the SRAM cell, and the access transistors (N3 and N4) and driver transistors (N1 and N2) are arranged on both sides of the SRAM cell. In the horizontal memory cell layout, the word line (WL) serving as the input of the access transistors (N3 and N4) is shared with an adjacent cell. That is, in the horizontal memory cell layout, the word line (WL) passes in the third wiring layer, and is connected to the polysilicons (PL2 and PL4) via contacts on the boundary positions of the cell (end portions in horizontal directions of FIGS. 2A and 2B). These contacts and polysilicons of the word line (WL) are shared with the adjacent SRAM cell.

In the case of an SRAM cell whose contact of a word line and the like are shared with an adjacent cell as exemplified as the above-mentioned horizontal memory cell layout, the word line cannot be switched to another word line in each single cell independently. That is, the word lines cannot be switched in an arbitrary position in the cell array. Accordingly, it is impossible to employ the technique for reducing the number of bit line pairs to be charged and discharged by using a plurality of word lines as shown in the configuration (FIG. 1) disclosed in JP-A-Heisei 8-167291. As the result, in the SRAM cell whose contact of the word line and the like are shared with the adjacent cell, it becomes difficult to intend to reduce the power consumption by reducing the number of times of unnecessary charging and discharging. As a countermeasure, a method to change the shape of SRAM cell and a method to dividing the memory cell array can be considered. However, there are problems that the former requires an effort of processes for memory cell development and that the latter causes deterioration of an area efficiency.

SUMMARY

The present invention seeks to solve one or more of the above problems, or to improve upon those problems at least in part.

In one embodiment, a semiconductor memory device includes: a first word line and a second word line; a plurality of first SRAM cells, each configured to include the first word line and the second word line and be connected to the first word line; a plurality of second SRAM cells, each configured to include the first word line and the second word line and to be connected to the second word line; and a mediating cell configured to be arranged between and adjacent to one of the plurality of first SRAM cells and one of the plurality of second SRAM cells and to be connected to the first word line and the second word line, wherein, in the mediating cell and the plurality of first SRAM cells, cells adjacent to each other share a first contact for the first word line, and wherein, in the mediating cell and the plurality of second SRAM cells, cells adjacent to each other share a second contact for the second word line.

According to the present invention, at least in a semiconductor memory device including an SRAM cell in which a contact of a word line is shared with an adjacent cell, power consumption due to charging and discharging of a bit line pair can be suppressed.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 3B shows the configuration of the SRAM cell in the semiconductor memory device according to the embodiment of the present invention;
FIG. 3C shows the configuration of the SRAM cell in the semiconductor memory device according to the embodiment of the present invention;
FIG. 7 shows a configuration of the semiconductor memory device according to the embodiment of the present invention;

FIG. 8A is a truth table of a column decoder output, row decoder output, and a memory cell address, the truth table being controlled by a controller of FIG. 7;
FIG. 8B is the truth table of the column decoder output, the row decoder output, and the memory cell address, the truth table being controlled by the controller of FIG. 7;
FIG. 10B is the plane view showing the example of the layout of the black boarder part of FIG. 9A.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Referring to attached drawings, a semiconductor memory device according to an embodiment of the present invention will be described. The embodiment of the present invention arranges a mediating cell for changing a word line in a memory cell array including an SRAM cell in which at least a contact of the word line is shared with an adjacent cell, maintaining regularity of a layout pattern of the SRAM cell. In this manner, the embodiment of the present invention enables a technique to be applied without increasing variations of the SRAM cells, the technique being for reducing of the number of bit line pairs to be charged and discharged by using a plurality of word lines. Thus, a power consumption due to the charging and discharging of the bit line pair can be suppressed. The embodiment will be described below in detail.

Figure 3A:
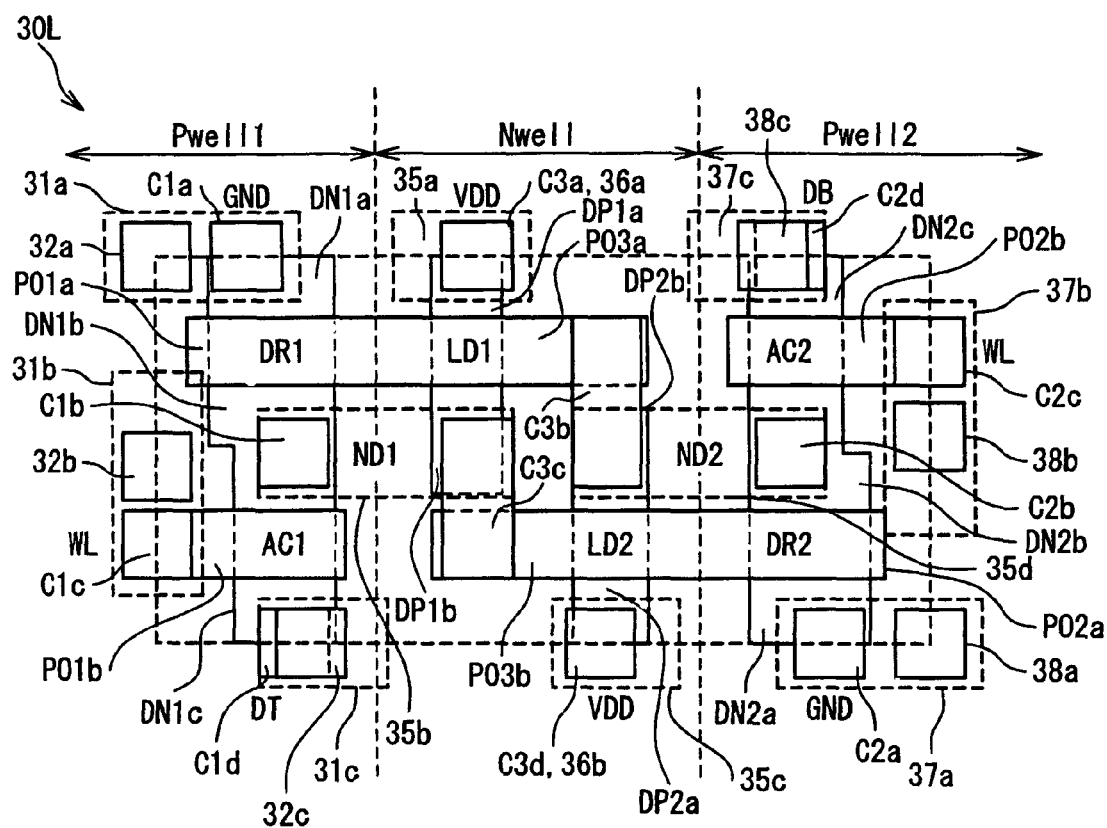
FIG. 3A shows a configuration of an SRAM cell in a semiconductor memory device according to an embodiment of the present invention.
Figure 4:
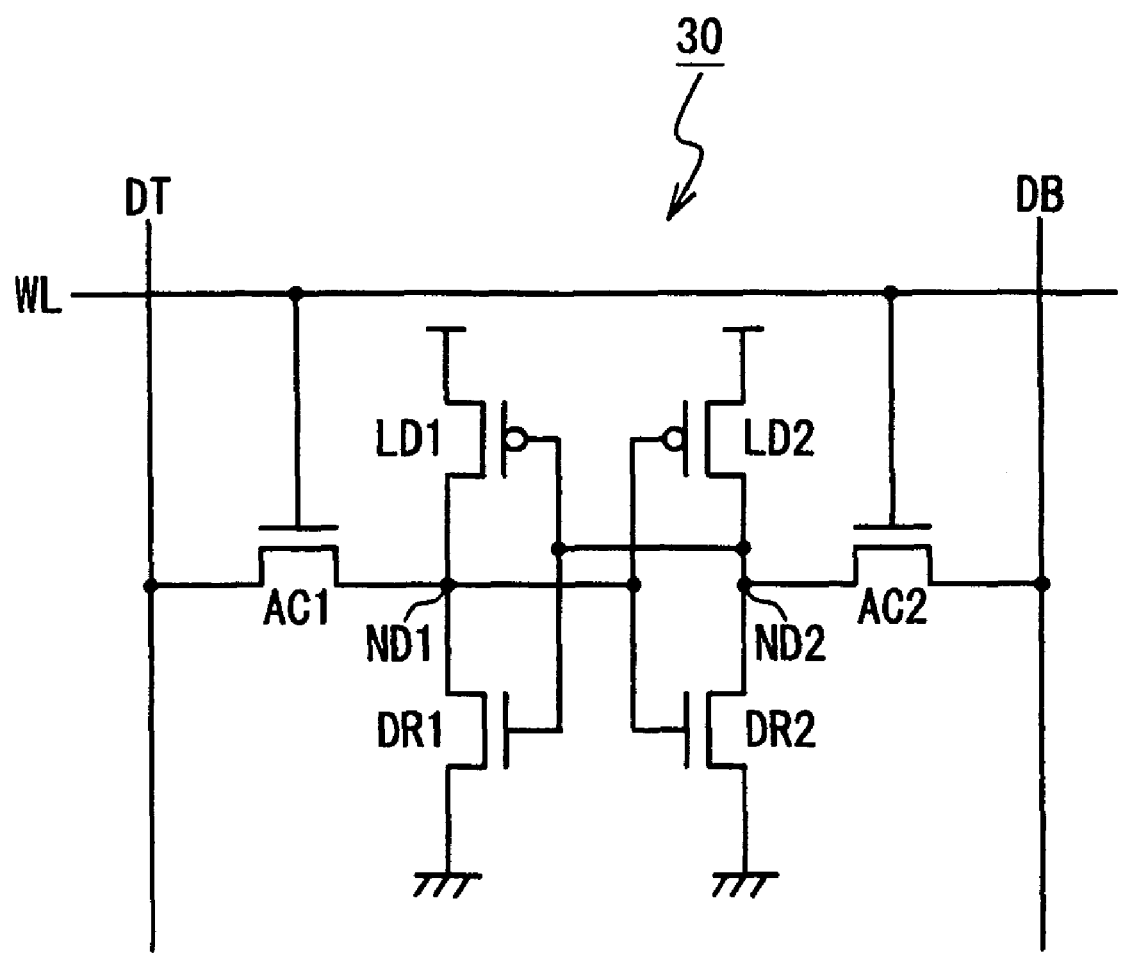
FIG. 4 shows the configuration of the SRAM cell in the semiconductor memory device according to the embodiment of the present invention.

At first, a configuration of the SRAM cell as a memory cell will be described. FIGS. 3A, 3B, 3C, and 4 show the configuration of the SRAM cell in the semiconductor memory device according to the embodiment of the present invention. FIG. 3A shows a plane view of a base layout 30L of an SRAM cell 30. FIGS. 3B and 3C show plane views of top layouts 30U$a$ and 30U$b$ of the SRAM cell 30 overlapped on the base layout 30L of FIG. 3A, respectively. FIG. 4 shows a circuit diagram of the SRAM cell 30. Here, as the SRAM cell 30, an SRAM cell of a CMOS structure will be described as an example. However, when being an SRAM cell in which a contact of a word line and the like are shared with an adjacent cell, the SRAM cell is not limited to the example. In addition, depending on an arrangement position in the memory cell array, a vertical inversion and a horizontal inversion may be carried out to the shown layout.

As shown in FIG. 4, the SRAM cell 30 is a one-port memory cell, which includes six transistors. Specifically, the SRAM cell 30 includes: a pMOS load transistor LD1 and an nMOS driver transistor DR1 configuring a first inverter on a left side; an nMOS access transistor AC1; a pMOS load transistor LD2 and an nMOS driver transistor DR2 configuring a second inverter on a right side; and an nMOS access transistor AC2. An input terminal of the second inverter is connected to an output node ND1 of the first inverter, and an output node ND2 of the second inverter is connected to an input terminal of the first inverter. In the nMOS access transistor AC1, the source is connected to the output node ND1 of the first inverter, the drain is connected to a bit line DT, and the gate is connected to a word line WL. In the nMOS access transistor AC2, the source is connected to the output node ND2 of the second inverter, the drain is connected to a bit line DB, and the gate is connected to the word line WL.

As shown in the base layout of FIG. 3A, the nMOS driver transistor DR1 and the nMOS access transistor AC1 are formed using diffusion layers DN1a, DN1b, and DN1c (DN1) in a Pwell 1. The nMOS driver transistor DR2 and the nMOS access transistor AC2 are formed using diffusion layers DN2a, DN2b, and DN2c (DN2) in a Pwell 2. The pMOS load transistor LD1 and the pMOS driver transistor LD2 are formed using diffusion layers DP1a and DP1b (DP1) and diffusion layers DP2a and DP2b (DP2), respectively, in an Nwell sandwiched by the Pwell 1 and the Pwell 2.

The nMOS driver transistor DR1 employs the diffusion layer DN1a as the source, the diffusion layer DN1b as the drain, and a polysilicon PO1a as the gate. The diffusion layer DN1a is connected to a ground line GND via a contact C1a, a first wiring line 31a, a first via 32a, and an after-mentioned top layout (30Ua or 30Ub). The diffusion layer DN1b is connected to a first wiring line 35b serving as the output node ND1 via a contact C1b. The polysilicon PO1a is shared with the gate of the pMOS load transistor LD1.

The nMOS access transistor AC1 employs the diffusion layer DN1b as the source, the diffusion layer DN1c as the drain, and a polysilicon PO1b as the gate. The diffusion layer DN1c is connected to a bit line DT via a contact C1d, a first wiring line 31c, a first via 32c, and the top layout (30Ua or 30Ub). The polysilicon PO1b is connected to the word line WL via a contact C1c, a first wiring line 31b, a first via 32b, and the top layout (30Ua or 30Ub). The polysilicon PO1b, the contact C1c, the first wiring line 31b, the first via 32b, and a related part of the top layout are shared with an adjacent SRAM cell (not shown in the drawing).

The pMOS load transistor LD1 employs the diffusion layer DP1a as the source, the diffusion layer DP1b as the drain, and a polysilicon PO3a as the gate. The diffusion layer DP1a is connected to a power source line VDD via a contact C3a, a first wiring line 35a, a first via 36a, and the top layout (30Ua or 30Ub). The diffusion layer DP1b is connected to the first wiring 35b via a contact C3c. The polysilicon PO3a is unified with the polysilicon PO1a, and is shared with the gate of the nMOS driver transistor DR1.

The nMOS driver transistor DR2 employs the diffusion layer DN2a as the source, the diffusion layer DN2b as the drain, and a polysilicon PO2a as the gate. The diffusion layer DN2a is connected to the ground line GND via a contact C2a, a first wiring line 37a, a first via 38a, and the top layout (30Ua or 30Ub). The diffusion layer DN2b is connected to a first wiring line 35d via a contact C2b as the output node ND2. The polysilicon PO2a is shared with the gate of the pMOS load transistor LD2.

The nMOS access transistor AC2 employs the diffusion layer DN2b as the source, the diffusion layer DN2c as the drain, and a polysilicon PO2b as the gate. The diffusion layer DN2c is connected to the bit line DB via a contact C2d, a first wiring line 37c, a first via 38c, and the top layout (30Ua or 30Ub). The polysilicon PO2b is connected to the word line WL via a contact C2c, a first wiring line 37b, a first via 38b, and the top layout (30Ua or 30Ub). The polysilicon PO2b, the contact C2c, the first wiring line 37b, the first via 38b, and the related part of the top layout are shared with the adjacent SRAM cell (not shown in the drawing).

The pMOS load transistor LD2 employs the diffusion layer DP2a as the source, the diffusion layer DP2b as the drain, and a polysilicon PO3b as the gate. The diffusion layer DP2a is connected to the power source line VDD via a contact C3d, a first wiring line 35c, a first via 36b, and the top layout (30Ua or 30Ub). The diffusion layer DP2b is connected to the first wiring line 35d via a contact C3b. The polysilicon PO3b is unified with the polysilicon PO2a, and is shared with the gate of the nMOS driver transistor DR2.

Specifically, in the nMOS driver transistor DR1 and the pMOS load transistor LD1, the both gates are connected by the polysilicon wiring lines (PO1a and PO3a), the both drains (DN1b and DP1b) are connected by the first wiring layer (35b) via the contacts (C1b and C3c), and thereby configuring the first inverter. In the nMOS driver transistor DR2 and the pMOS load transistor LD2, the both gates are connected by the polysilicon wiring lines (PO2a and PO3b), the both drains (DN2b and DP2b) are connected by the first wiring layer (35d) via the contacts (C2b and C3b), and thereby configuring the second inverter. The output node ND1 of the first inverter is connected to the input node of the second inverter, and the output node ND2 of the second inverter is connected to the input node of the first inverter. In this manner, a latch circuit for storing data is configured.

Two types of the top layouts of FIG. 3B and FIG. 3C are prepared to the base layout of FIG. 3A. In the after-mentioned SRAM cell 30 using a word line WLA as the word line WL, the top layout of FIG. 3B is employed to the base layout of FIG. 3A. Meanwhile, in the SRAM cell 30 using a word line WLB as the word line WL, the top layout of FIG. 3C is employed to the base layout of FIG. 3A. For this reason, arrangement of second vias for connecting the word lines WLA and WLB in the third wiring layer to the gates of the access transistors is different between the top layout of FIG. 3B and the top layout of FIG. 3C. That is, in FIG. 3B, the word line WLA is connected to the gates of the access transistors, and in FIG. 3C, the word line WLB is connected to the gates of the access transistors.

In the case of FIG. 3B, following the base layout (the contact C1a, the first wiring line 31a, and the first via 32a), the diffusion layer DN1a of the nMOS driver transistor DR1 is connected to the ground line GND in a fourth wiring layer via a second wiring line 41a, a second via 45a, a third wiring line 48a, and a third via 46a. In addition, following the base layout (the contact C1c, the first wiring line 31b, and the first via 32b), the polysilicon PO1b of the nMOS access transistor AC1 is connected to the word line WLA in the third wiring layer via a second wiring line 42a and a second via 43a. In the same manner, following the base layout (the contact C2a, the first wiring line 37a, and the first via 38a), the diffusion layer DN2a of the nMOS driver transistor DR2 is connected to the ground line GND in the fourth wiring layer via a second wiring line 41b, a second via 45b, a third wiring line 48b, and a third via 46b. In addition, following the base layout (the contact C2c, the first wiring line 37b, and the first via 38b), the polysilicon PO2b of the nMOS access transistor AC2 is connected to the word line WLA in the third wiring layer via a second wiring line 42b and a second via 43b. Additionally, in the third wiring layer, the bit lines DT and DB and the power source line VDD are included.

Figure 1:
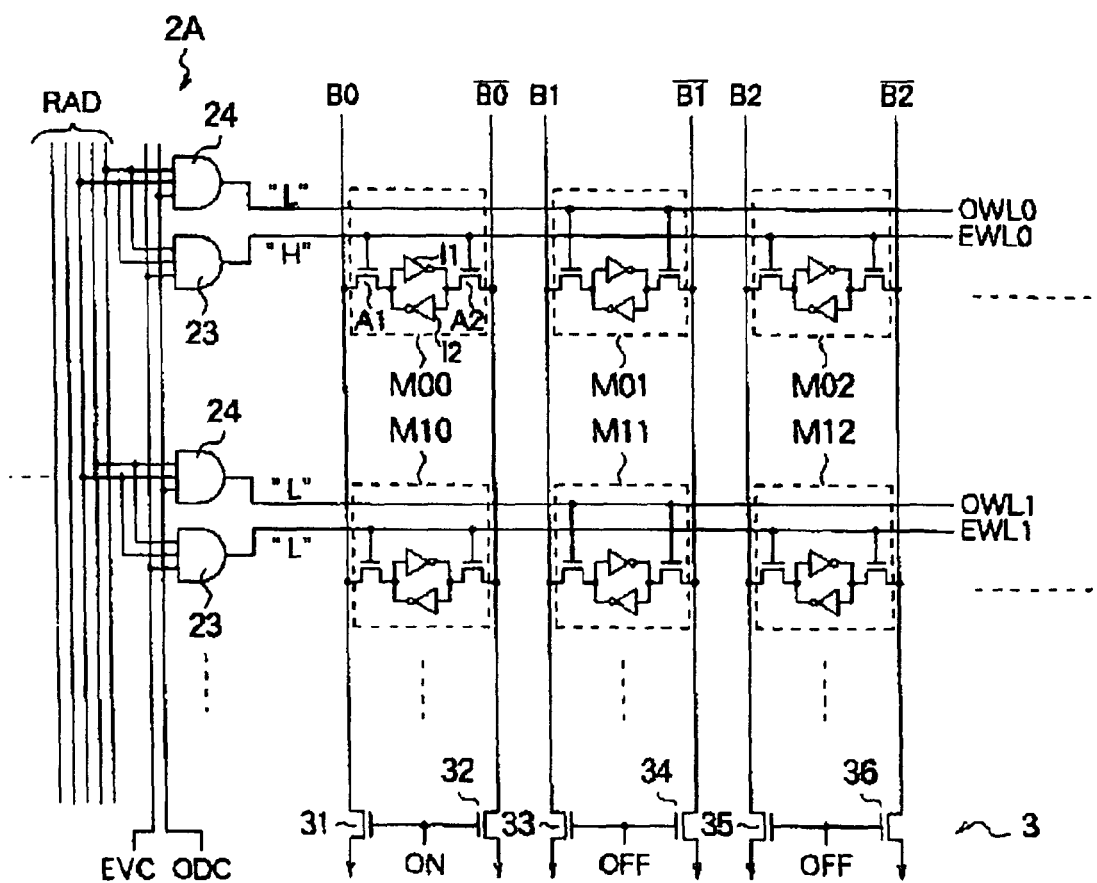
FIG. 1 directly shows FIG. 1 of JP-A-Heisei 8-167291.
Figure 2A:
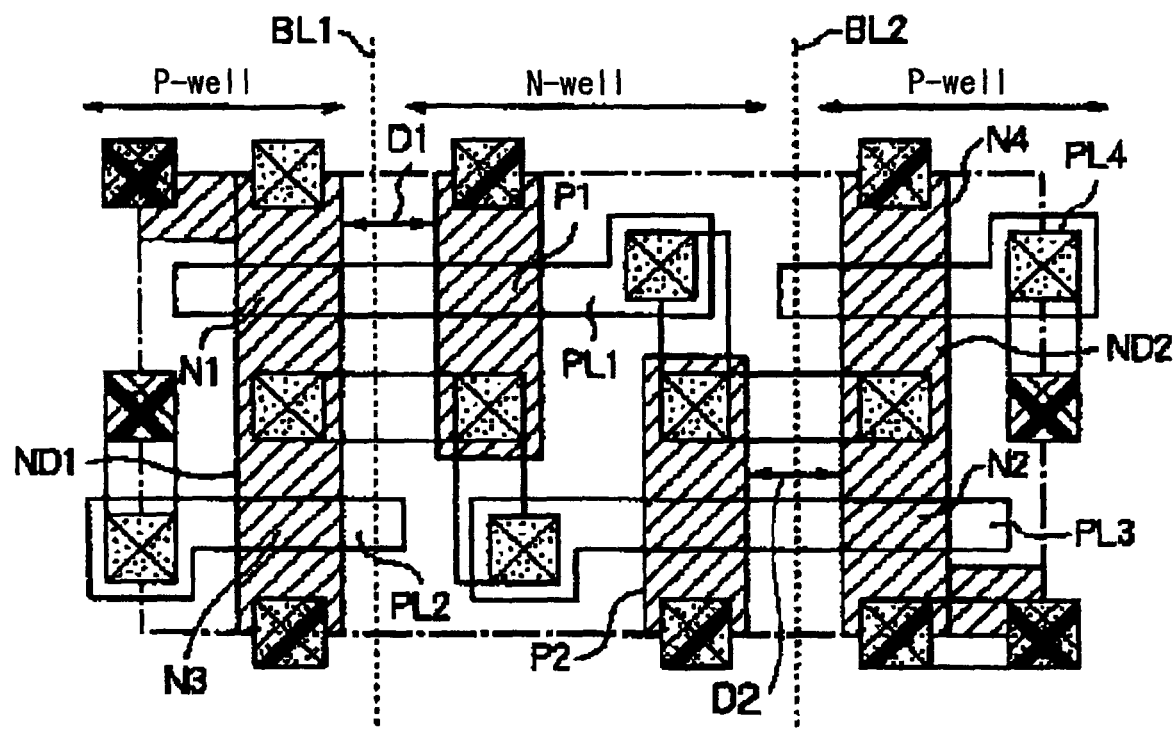
FIG. 2A directly shows FIG. 1 of JP-3523762(B2)
Figure 2B:
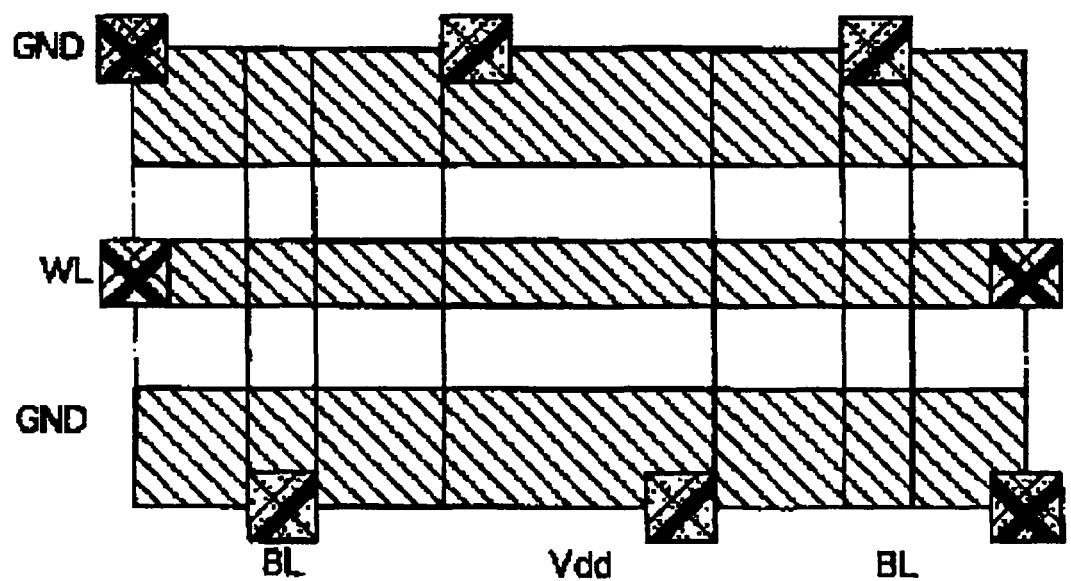
FIG. 2B directly shows FIG. 2 of JP-3523762(B2)
Figure 2C:
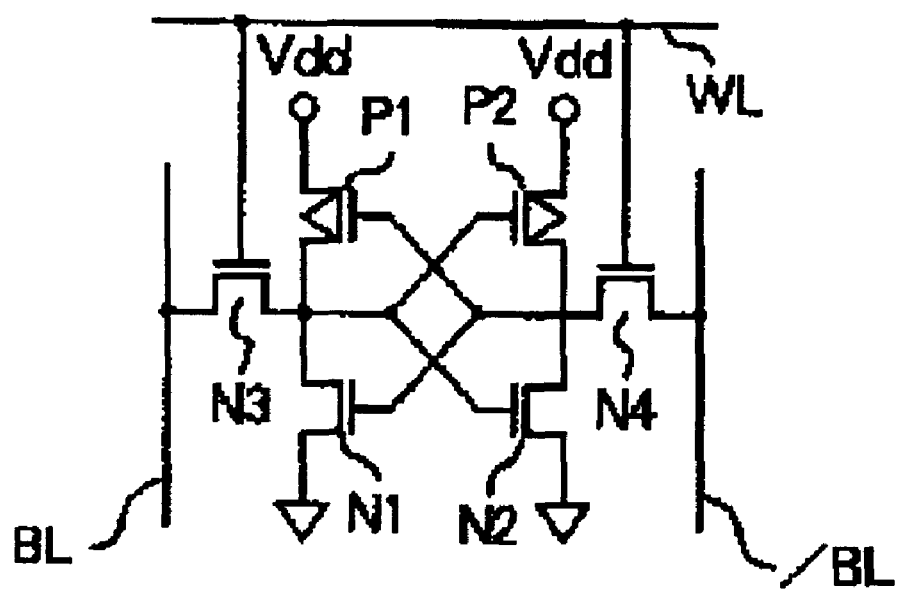
FIG. 2C directly shows FIG. 16 of JP-3523762(B2)

In the case of FIG. 1C, following the base layout (the contact C1a, the first wiring line 31a, and the first via 32a), the diffusion layer DN1a of the nMOS driver transistor DR1 is connected to the ground line GND in the fourth wiring layer via the second wiring line 41a, the second via 45a, the third wiring line 48a, and the third via 46a. In addition, following the base layout (the contact C1c, the first wiring line 31b, and the first via 32b), the polysilicon PO1b of the nMOS access transistor AC1 is connected to the word line WLB in the third wiring layer via the second wiring line 42a and a second via 43c. In the same manner, following the base layout (the contact C2a, the first wiring line 37a, and the first via 38a), the diffusion layer DN2a of the nMOS driver transistor DR2 is connected to the ground line GND in the fourth wiring layer via the second wiring line 41b, the second via 45b, the third wiring 48b, and the third via 46b. In addition, following the base layout (the contact C2c, the first wiring line 37b, and the first via 38b), the polysilicon PO2b of the nMOS access transistor AC2 is connected to the word line WLB in the third wiring layer via the second wiring line 42b and a second via 43d. Additionally, in the third wiring layer, the bit lines DT and DB and the power source line VDD are included.

The SRAM cell 30 has two Pwells and one Nwell. Specifically, there are two boundary lines between the Pwells and the Nwell. The Pwell and the Nwell are extended in a bit line direction (hereinafter also referred to as a vertical direction). The arrangement directions of the sources and drains (the arrangement directions of the respective diffusion layers) of the respective nMOS transistors and pMOS transistors in the SRAM cell 30 are parallel (in the vertical direction) to the direction in which the respective wells are extended. The polysilicons used for the gates of the respective MOS transistors in the SRAM cell 30 are extended in parallel to each other in the word line direction (hereinafter also referred to as a horizontal direction). The SRAM cell 30 shares the contacts and polysilicons connected to the word line with the cells adjacent in the word line direction. The bit line direction (the vertical direction) perpendicularly intersects with the word line direction (the horizontal direction).

Next, a configuration of a mediating cell for changing the word line will be described.

Figure 5A:
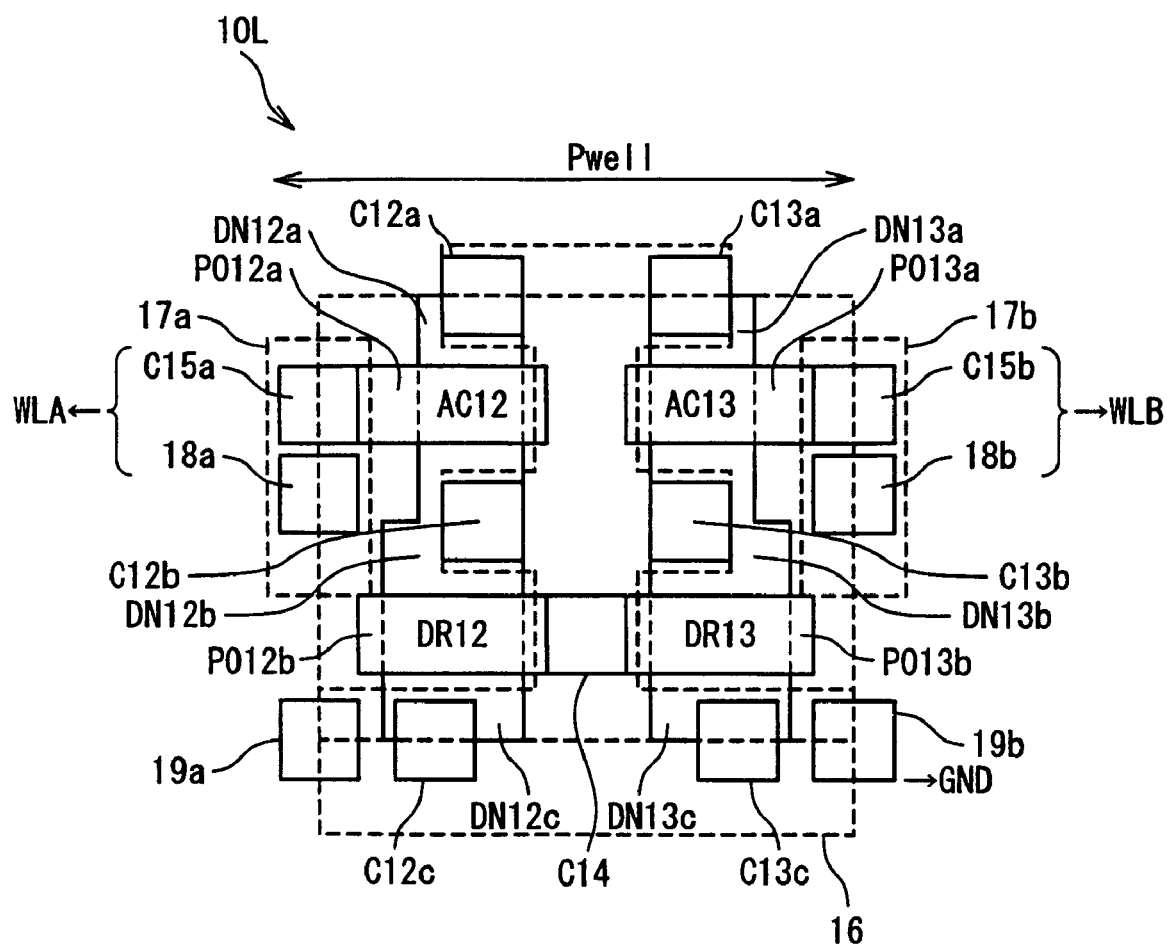
FIG. 5A shows a configuration of a mediating cell in the semiconductor memory device according to the embodiment of the present invention.
Figure 5B:
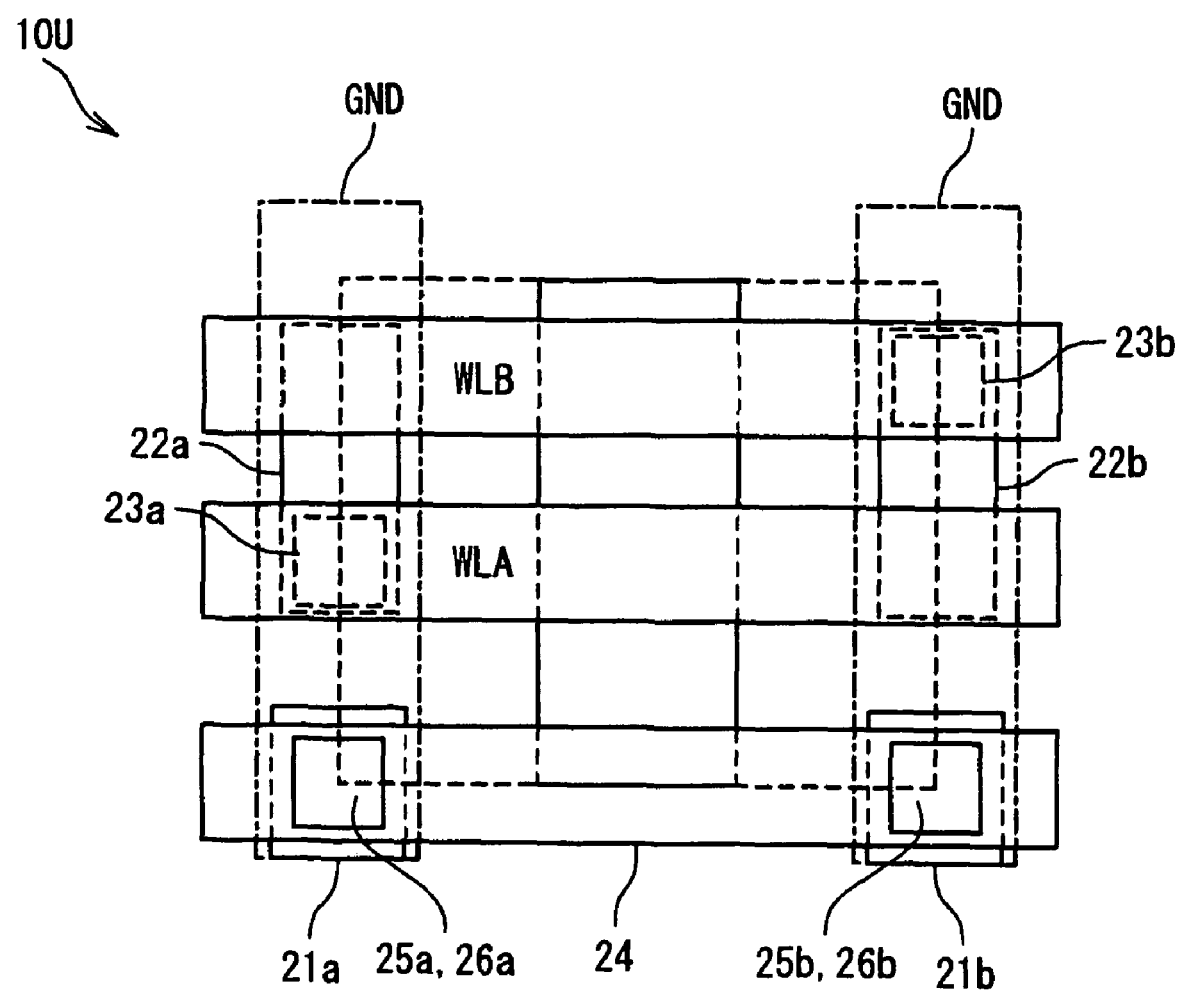
FIG. 5B shows the configuration of the mediating cell in the semiconductor memory device according to the embodiment of the present invention.
Figure 6:
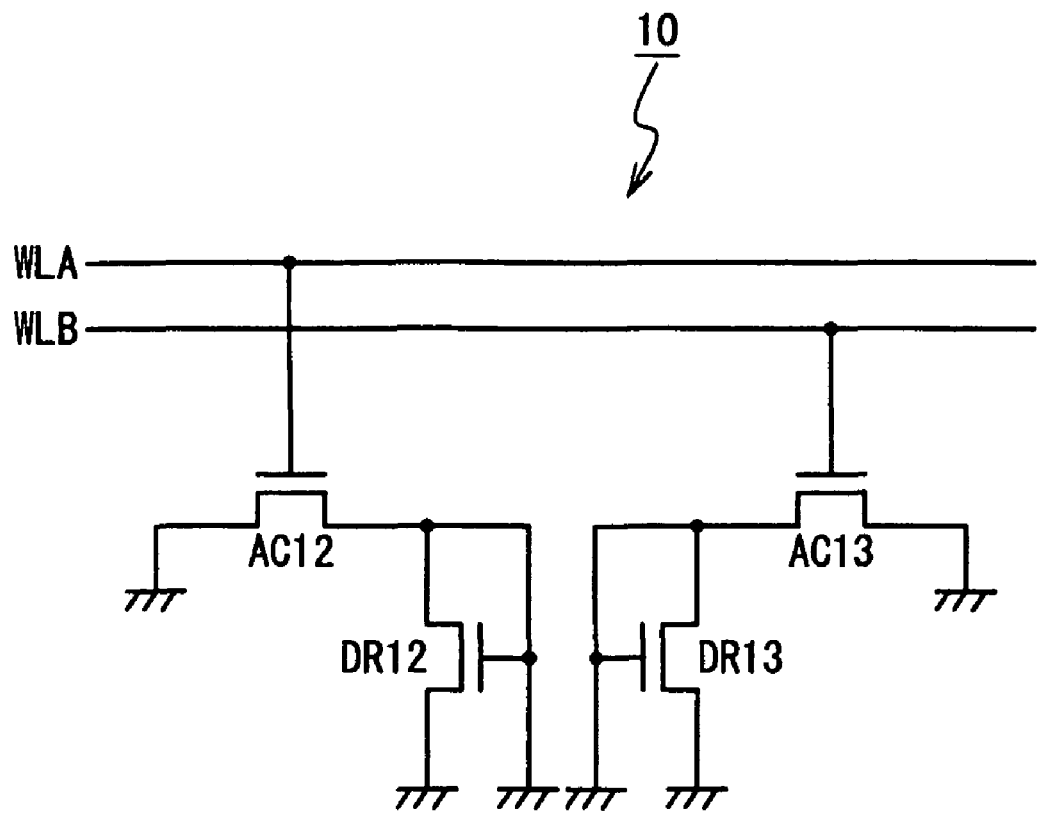
FIG. 6 shows the configuration of the mediating cell in the semiconductor memory device according to the embodiment of the present invention.

FIGS. 5A, 5B, and 6 show the configuration of the mediating cell in the semiconductor memory device according to the embodiment of the present invention. FIG. 5A shows a plane view of a base layout 10L of the mediating cell 10. FIG. 5B shows a plane view of a top layout 10U of the mediating cell 10, the top layout 10U overlapped on the base layout 10L of FIG. 5A. FIG. 6 shows a circuit diagram of the mediating cell 10. Here, the mediating cell 10 having a configuration where the Nwell part is removed from the SRAM cell 30 will be described as an example. However, when having layout pattern continuity between the mediating cell 10 and the SRAM cell, the mediating cell is not limited to the example. In addition, depending on the arrangement position in the memory cell array, a vertical inversion and a horizontal inversion may be carried out to the shown layout.

As shown in FIG. 6, the mediating cell 10 includes: an nMOS access transistor AC12 and an nMOS driver transistor DR12 that are connected to the word line WLA; and an nMOS access transistor AC13 and an nMOS driver transistor DR13 that are connected to the word line WLB. The source, drain, and gate of the nMOS driver transistor DR12 are fixed to the GND. The source and drain of the nMOS access transistor AC12 are fixed to the GND, and the gate is connected to the word line WLA. The source, drain, and gate of the nMOS driver transistor DR13 are fixed to the GND. The source and drain of the nMOS access transistor AC13 are fixed to the GND, and the gate is connected to the word line WLB.

As shown in the base layout of FIG. 5A, the nMOS driver transistor DR12 and the nMOS access transistor AC12 are formed using the diffusion layer DN12a, DN12b, and DN12c (DN12) in the Pwell. The nMOS driver transistor DR13 and the nMOS access transistor AC13 are formed using the diffusion layer DN13a, DN13b, and DN13c (DN13) in the Pwell. The transistor using the diffusion layer DN12 and the transistor using the diffusion layer DN13 are in a Y-symmetry layout about the center of the cell layout.

The nMOS driver transistor DR12 employs the diffusion layer DN12c as the source, the diffusion layer DN12b as the drain, and the polysilicon PO12b as the gate. The diffusion layers DN12c and DN12b are connected to the first wiring line 16 via the contacts C12c and C12b, respectively. The polysilicon PO12b is connected to the first wiring line 16 via the contact C14. The first wiring line 16 is connected to the ground line GND via first vias 19a and 19b and via the after-mentioned top layout (10U). The polysilicon PO12b is unified with the gate of the nMOS driver transistor DR13, and is shared with the nMOS driver transistor DR13.

The nMOS access transistor AC12 employs the diffusion layer DN12b as the source, the diffusion layer DN12a as the drain, and the polysilicon PO12a as the gate. The diffusion layer DN12a is connected to the first wiring line 16 via the contact C12a. The polysilicon PO12a is connected to the word line WLA via the contact C15a, the first wiring line 17a, the first via 18a, and the top layout (10U). In addition, the polysilicon PO12a is shared with the gate of the nMOS access transistor AC of the adjacent SRAM cell 30.

The nMOS driver transistor DR13 employs the diffusion layer DN13c as the source, the diffusion layer DN13b as the drain, and the polysilicon PO13b as the gate. The diffusion layers DN13c and DN13b are connected to the first wiring line 16 via the contacts C13c and C13b, respectively. The polysilicon PO13b is connected to the first wiring line 16 via the contact C14. The polysilicon PO13b is unified with the gate of the nMOS driver transistor DR12, and is shared with the nMOS driver transistor DR12.

The nMOS access transistor AC13 employs the diffusion layer DN13b as the source, the diffusion layer DN13a as the drain, and the polysilicon PO13a as the gate. The diffusion layer DN13a is connected to the first wiring line 16 via the contact C13a. The polysilicon PO13a is connected to the word line WLB via the contact 15b, the first wiring line 17b, the first via 18b, and the top layout (10U). In addition, the polysilicon PO13a is shared with the gate of the nMOS access transistor AC of the adjacent SRAM cell 30.

As shown in the top layout of FIG. 5B, following the base layout (the contact C12c, the first wiring line 16, and the first via 19a), the diffusion layer DN1c of the nMOS driver transistor DR12 is connected to the ground line GND in the fourth wiring layer via a second wiring line 21a, a second via 25a, a third wiring line 24, and a third via 26a. In addition, following the base layout (the contact C15a, the first wiring line 17a, and the first via 18a), the polysilicon PO12a of the nMOS access transistor AC12 is connected to the word line WLA in the third wiring layer via a second wiring line 22a and a second via 23a. In the same manner, following the base layout (the contact C13c, the first wiring line 16, and the first via 19b), the diffusion layer DN13c of the nMOS driver transistor DR13 is connected to the ground line GND in the fourth wiring layer via a second wiring line 21b, a second via 25b, a third wiring line 24, and a third via 26b. In addition, following the base layout (the contact C15b, the first wiring line 17b, and the first via 18b), the polysilicon PO13a of the nMOS access transistor AC13 is connected to the word line WLB in the third wiring layer via a second wiring line 22b and a second via 23b.

Meanwhile, when having the layout pattern continuity with the adjacent SRAM cell 30, the mediating cell 10 may have the substantially same configuration as that of the SRAM cell 30. For example, a configuration where the Nwell part of the SRAM cell 30 is fitted into the center part of the mediating cell 10 can be considered. In addition, without considering an area efficiency, a configuration where two SRAM cells for the word line WLA and for the word line WLB are arranged in line as the mediating cells 10 may be also considered.

FIG. 7 shows a configuration of the semiconductor memory device according to the embodiment of the present invention. Here, as an example of the semiconductor memory device, a SRAM 1 of four columns is shown. Specifically, four columns are connected to one IO[i] (i=1 to n). However, the semiconductor memory device is not limited to the four columns, and may be applied to eight columns, sixteen columns, thirty-two columns, and so on. The SRAM 1 includes a memory cell array 2, a row decoder 4, IC[i] 5–i (i=1 to n), a column decoder 6, and a controller 3 for controlling them.

In the memory cell array 2, memory cells MC (memory cells 30) and mediating cells DC (mediating cells 10) for changing the word line are arranged on a matrix shape. The mediating cell DC is the mediating cell 10 described in FIGS. 5A, 5B, and 6. The memory cells MC1 and MC2 are the SRAM cells 30 described in FIGS. 3A to 3C and 4. Here, a difference between memory cells MC1 and MC2 is the difference of the arrangement position of the second via shown in FIGS. 3B and 3c. That is, the memory cell MC1 as the SRAM cell 30 has the base layout of FIG. 3A and the top layout of FIG. 3B. The memory cell MC1 is connected to the word line WLA (WLA0, ..., WLAn) extending from the row decoder 4. Meanwhile, the memory cell MC2 as the SRAM cell 30 has the base layout of FIG. 3A and the top layout of FIG. 3C. The memory cell MC2 is connected to the word line WLB (WLB0, ..., WLBn) extending from the row decoder 4.

Of the configuration of four columns, upper columns of a bit line pair of DT0 and DB0 and a bit line pair of DT1 and DB1 are configured by the memory cells MC1, and lower columns of a bit line pair of DT2 and DB2 and a bit line pair of DT3 and DB3 are configured by the memory cells MC2. The mediating cell DC is arranged in a center between the memory cells MC1 and MC2. Here, the mediating cell DC is arranged so that the gate of the access transistor can be a common input with the gate of the access transistor of an adjacent memory cell MC. The respective bit line pairs are connected to IO[1] 5–1 via the column decoder 6. That is, two memory cells MC1, one mediating cell DC, two memory cells MC2 are continuously arranged in line to configure one group. On this occasion, the mediating cell DC is arranged on a boundary between the memory cells MC1 and MC2 to enable the memory cells MC1 and MC2 to use different word lines WLA and WLB respectively. The following configuration of four columns regarding each of IO[2] to IO[n] is the same. In addition, a cell array arrangement of IO[1] including four columns is in the order of MC1-MC1-DC-MC2-MC2. The cell array arrangement of IO[2] is in a Y-mirror arrangement of the cell array arrangement of IO[1], namely, MC2-MC2-DC-MC1-MC1. The cell array arrangement of IO[3] is in the Y-mirror arrangement of the cell array arrangement of IO[2], namely, MC1-MC1-DC-MC2-MC2. Similarly, a cell array arrangement of the following IO[i] repeats the Y-mirror arrangement.

Meanwhile, the case where the memory cells are divided into two groups (the case where the number of word lines is two) is shown here as an example; however, the present invention is not limited to the example, and also may be applied to the case where the memory cells are divided into further many groups (the case of having further many word lines according to the number of groups).

FIGS. 8A and 8B are truth tables of a column decoder output, a row decoder output, and a memory cell address, controlled by the controller 3 of FIG. 7. Here, FIG. 8A is a table showing which address corresponds to the column decoder output Cj (j=0 to 3) and the row decoder output WL(A, B)k (k=0 to m). Meanwhile, FIG. 8B is a table showing which column decoder output Cj and row decoder output WL (A, B)k correspond to the address on the basis of the memory cell address.

For example, a memory cell of the memory cell address 1 is selected on the basis of the column decoder output C0 and n the row decoder output WLA0. A memory cell of the memory cell address 2 is selected on the basis of the column decoder output C1 and the row decoder output WLA0. A memory cell of the memory cell address 3 is selected on the basis of the column decoder output C2 and the row decoder output WLB0. Similarly, the following selection is shown as in FIGS. 8A and 8B.

Figure 9A:
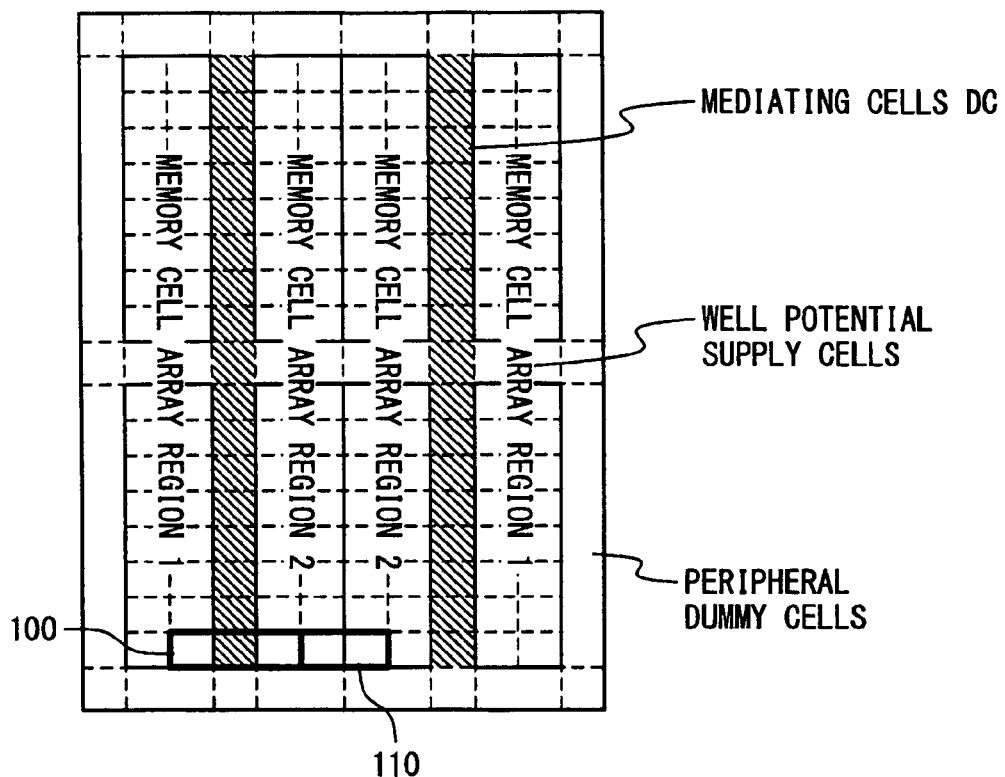
FIG. 9A shows an overview of a cell array arrangement of FIG. 7.
Figure 9B:
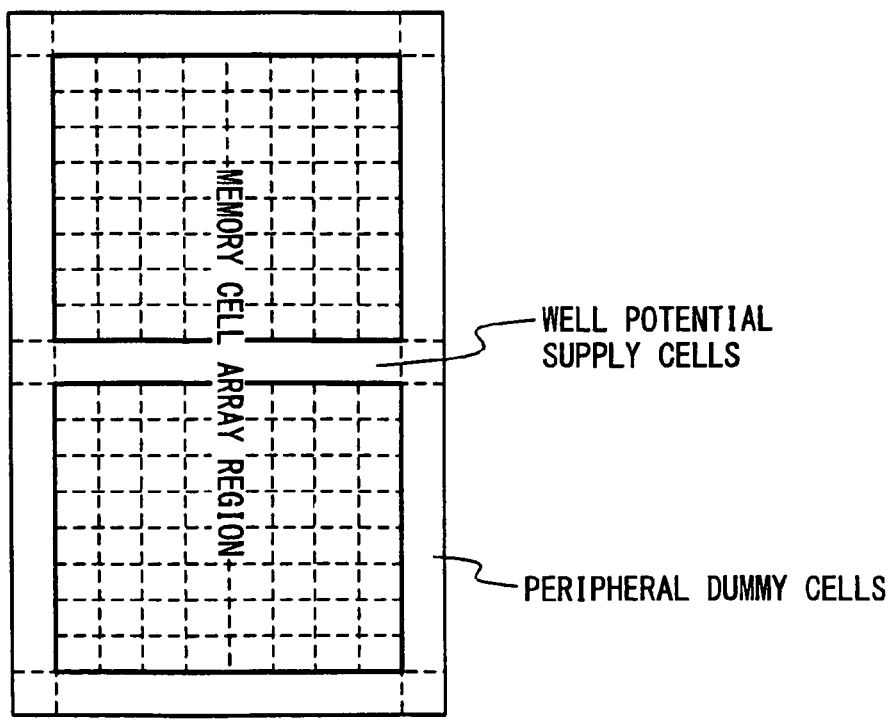
FIG. 9B shows the overview of the cell array arrangement of FIG. 7.

FIGS. 9A and 9B show overviews of the cell array arrangement. Here, FIG. 9A is an array arrangement of the present invention of FIG. 7, and FIG. 9B is a conventional array arrangement. As shown in FIG. 9B, the conventional memory cell array includes a memory cell array region, well potential supply cells, and peripheral dummy cells. The peripheral dummy cells are provided on a periphery of the memory cell array region to avoid an influence from the outside of the memory cell array, considering regularity of the memory cell array. The well potential supply cells is provided to a predetermined position inside the memory cell array region to supply a Nwell potential and a Pwell potential (the power source GND is enhanced by using an upper layer wiring lines if necessary).

Meanwhile, as shown in FIG. 9A, the memory cell array according to the present embodiment is different from the conventional case in that the mediating cells for changing word line are further included and that the memory cell array region is divided. That is, the memory cell array includes a memory cell array region 1, a memory cell array region 2, mediating cells for changing word line, well potential supply cells, and peripheral dummy cells. The peripheral dummy cells and the well potential supply cells are the same as those of the conventional case.

The SRAM cells arranged in the memory cell array region 1 are, for example, the memory cells MC1 configured based on FIGS. 3A and 3B. The SRAM cells arranged in the memory cell array region 2 are, for example, the memory cells MC2 configured based on FIGS. 3A and 3C. The word line connected to the SRAM cells of the memory cell array region 1 and the word line connected to the SRAM cells of the memory cell array region 2 are different from each other. The mediating cells for changing word line are the mediating cells DC configured based on FIGS. 5A and 5B. In order to change the word line of the memory cell array region 1 and the word line of the memory cell array region 2, the mediating cell for changing word line is arranged between the memory cell array region 1 and the memory cell array region 2. The arrangement of the first memory cell array region 1—the mediating cells for changing word line—the memory cell array region 2 are in the Y-mirror arrangement to the arrangement of the next memory cell array region 2—the mediating cells for changing word line—the memory cell array region 1. Specifically, the two sets of the memory cell array region 1—the mediating cells for changing word line—the memory cell array region 2 are in a symmetrical position to a boundary between the sets (a boundary between the memory cells MC2 of the memory cell array regions 2).

Figure 10A:
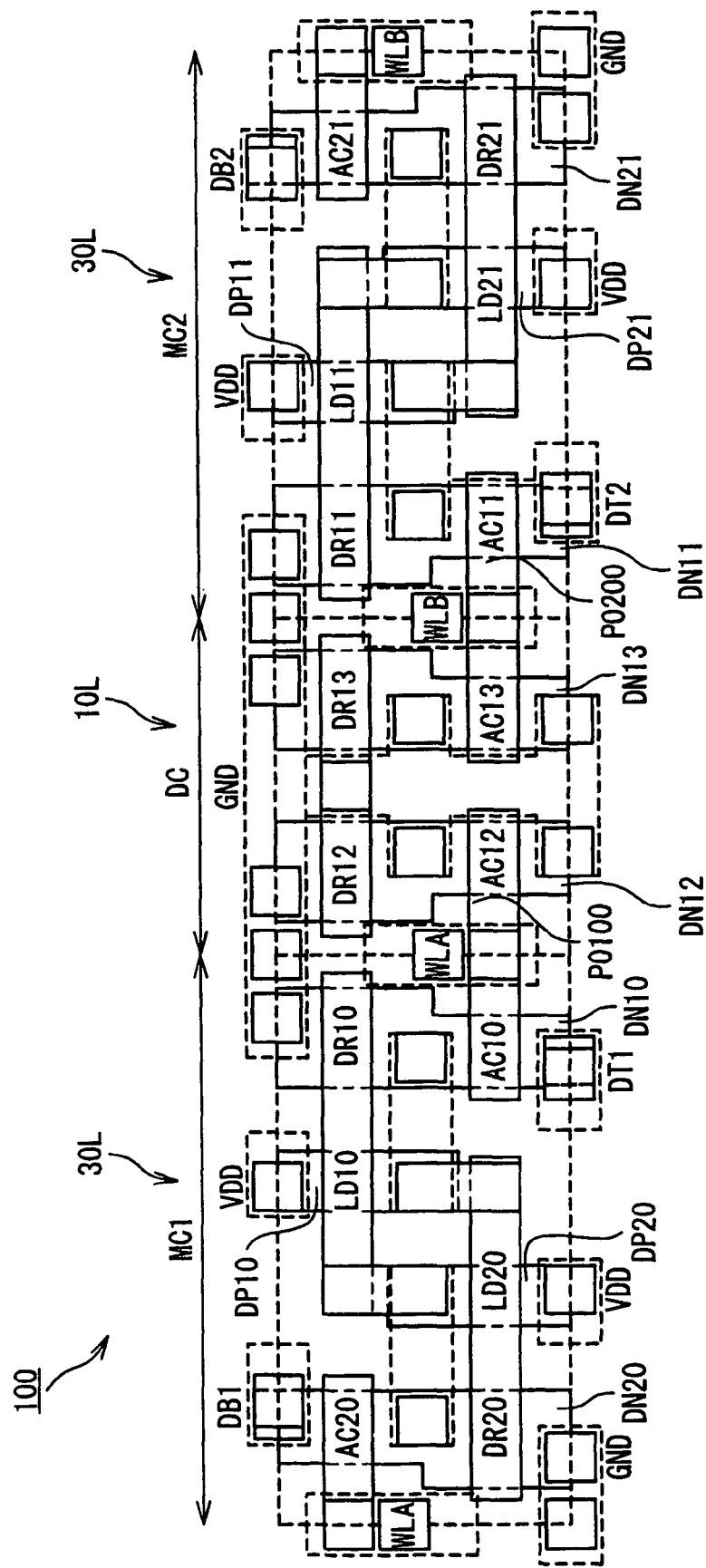
FIG. 10A is a plane view showing an example of a layout of a black boarder part of FIG. 9A.

FIGS. 10A and 10B are plane views showing an example of a layout of a black boarder part 100 of FIG. 9A. Here, the black boarder part 100 is a region including memory cell MC1 of the memory cell array region 1, the mediating cell DC for changing word line, and the memory cell MC2 of the memory cell array region 2. In addition, FIG. 10A shows the base layout, and FIG. 10B shows the top layout, respectively. The memory cell MC1 is the SRAM cell 30 and is the same as that configured based on FIGS. 3A and 3B, but is horizontally inverted. Access transistors AC10 and AC20, drive transistors DR10 and DR20, and load transistors LD10 and LD20 correspond to the access transistors AC1 and AC2, the drive transistors DR1 and DR2, the load transistors LD1 and LD2 of FIGS. 3A and 3B, respectively. The memory cell MC2 is the SRAM cell 30 and is the same as that configured based on FIGS. 3A and 3C. Access transistors AC11 and AC21, drive transistors DR11 and DR21, and load transistors LD11 and LD21 correspond to the access transistors AC1 and AC2, the drive transistors DR1 and DR2, the load transistors LD1 and LD2 of FIGS. 3A and 3C, respectively. The mediating cell DC is the mediating cell 10 for changing word line and is the same as that configured based on FIGS. 5A and 5B, but is vertically inverted (or horizontally inverted).

The word line WLA is connected to the access transistors AC20 and AC10 of the memory cell MC1. The polysilicon of the access transistor AC10 and the polysilicon of the access transistor AC12 of the mediating cell DC adjacent to the memory cell MC1 are the same polysilicon PO100. That is, the word line WLA is connected to the access transistors AC12 of the mediating cell DC. The memory cell MC1 and the mediating cell DC share the word line WLA. Since the word lines WLA and WLB pass through above the memory cell MC1, it can be seen that the memory cell MC1 includes the word lines WLA and WLB. Meanwhile, the word line WLB is connected to the access transistors AC21 and AC11 of the memory cell MC2. The polysilicon of the access transistor AC11 and the polysilicon of the access transistor AC13 of the mediating cell DC adjacent to the memory cell MC2 are the same polysilicon PO200. That is, the word line WLB is connected to the access transistors AC13 of the mediating cell DC. The memory cell MC2 and the mediating cell DC share the word line WLB. Since the word lines WLA and WLB pass through above the memory cell MC2, it can be seen that the memory cell MC2 includes the word lines WLA and WLB.

Figure 11A:
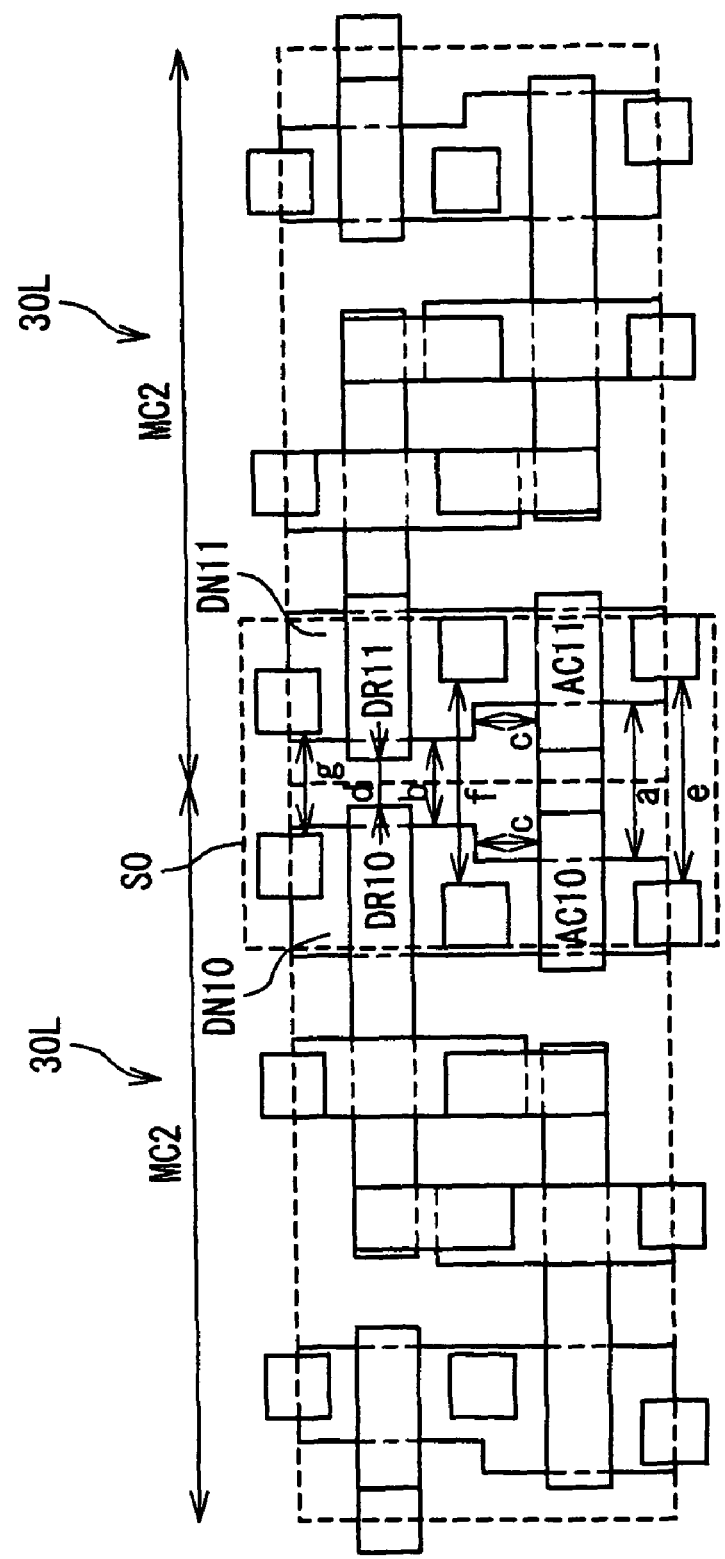
FIG. 11A is a plane view showing an example of a base layout of the black boarder part of FIG. 9A.
Figure 11B:
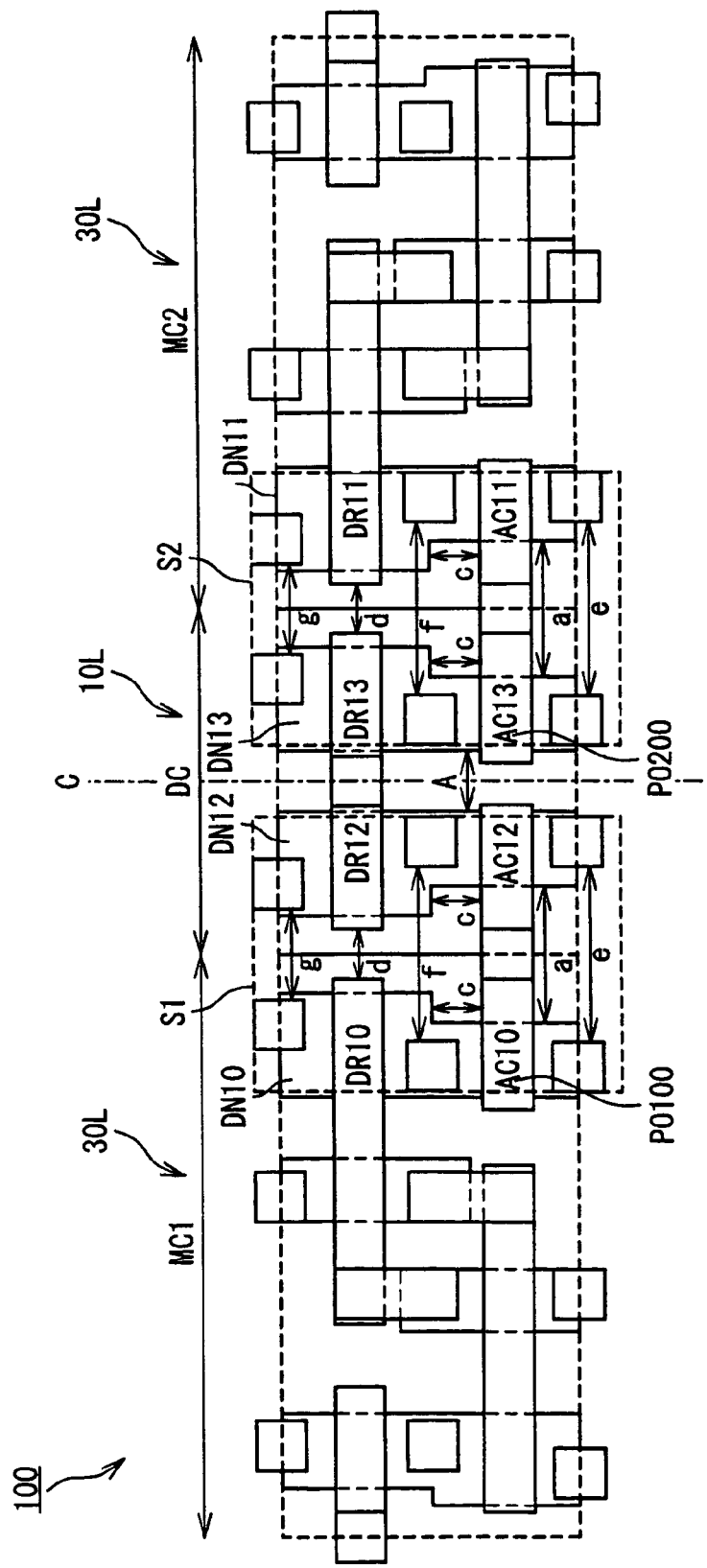
FIG. 11B is a plane view showing the example of the base layout of the black boarder part of FIG. 9A.

FIGS. 11A and 11B are plane views showing examples of the base layout of the black border part 110 and the base layout of the black border part 100, respectively, shown in FIG. 9A. FIGS. 11A and 11B are shown to compare the base layout of the black border part 110 (FIG. 11A) with the base layout of the black border part 100 (FIG. 11B; the same region as FIG. 10A). Here, the black border part 110 (FIG. 11A) is a region where the memory cells MC2 of the same type are arranged in line. Compared to the region where the memory cells MC1 of the same type are arranged in line, this is substantially the same other than that the arrangement of the second via (through which the word lines WLA or WLB in the third wiring layer is connected to the gate of the access transistor) is different. That is, the black border part 110 (FIG. 11A) shows a state in the region where the SRAM cells (FIG. 3A to FIG. 3C) are arranged in line, exemplifying the memory cells MC2.

As understood by comparing FIG. 11A with FIG. 11B, in the arrangement of FIG. 11A where the right-side memory cell MC2 and the left-side memory cell MC2 that are in the Y-mirror arrangement are adjacent with each other and in the arrangement of FIG. 11B where the mediating cell DC for changing word line is provided between the memory cell MC1 and the memory cell MC2, a region S0, a region S1, and a region S2, each of which is surrounded by a broken line, have the substantially same configuration. Specifically, in the region S0, the region S1, and the region S2, dimensions of transistor gate length, STI (Shallow Trench Isolation) isolation dimensions a, b, and c, polysilicon distances d, and contact positions e, f, and g are the same.

Here, in FIG. 11A, the arrangement where the memory cells MC2 and MC2 adjacent to each other is, because the layout pattern has the continuity, the arrangement where the manufacturing variations due to discontinuity of the layout pattern are not generated. For example, in the region where the memory cells MC2 are arranged in line, a wiring line density is substantially the same and the variation is small in any part (within an area of approximately one cell). Such arrangement is designed so as to be optimum, considering a manufacturing yield, and is the same as that of the conventional case. Accordingly, when the same positional relation as the positional relation between the memory cells MC2 in the region S0 (for example; the STI isolation dimension, the polysilicon distance, and the contact position) and a structure of the memory cell MC2 in the region S0 are included, it can be considered that the manufacturing variations due to the discontinuity of the layout pattern is not generated and that probability of deterioration of the manufacturing yield does not exist.

Meanwhile, as shown in FIG. 11B, in the present embodiment, in the region S1, the layout pattern including the diffusion layer DN10 in the memory cell MC1 adjacent to the mediating cell DC and the layout pattern including the diffusion layer DN12 in the mediating cell DC adjacent to the memory cell MC1 are designed so as to have the same shape, to be symmetry with a cell boundary (the boundary between the memory cell MC1 and mediating cell DC), and to have a predetermined positional relations. Here, the predetermined positional relation is a positional relation in the region S1 where the continuity of a mask pattern existing in the memory cell MC1 region (the region where the memory cell MC1 is continuously arranged) and in the memory cell MC2 region (the region where the memory cell MC2 is continuously arranged) does not lost. That is, the positional relation is that where manufacturing conditions of the etching, CMP (chemical mechanical polishing), film formation, and the like in the memory cell MC1 region and the memory cell MC2 region are not varied even when the region S1 exists, that is, where the manufacturing variation due to the discontinuity of the mask pattern is not generated. For example, the relation means that in the memory cell MC1 region, (the region S1), the mediating cell DC, (the region S2), and the memory cell MC2 region, which are arranged in line, the wiring line density is substantially the same and its variation is small in any part (within an area of approximately one cell), and the positional relation between the memory cell MC1 and the mediating cell DC in the region S1 (for example; the STI isolation dimension, the polysilicon distance, and the contact position) is substantially the same as the positional relation between the adjacent memory cells MC1. On this occasion, in the adjacent memory cell MC1 and mediating cell DC, the shapes of facing parts are symmetry with the boundary of the cell. The configuration is the same as that of the region S0 shown in FIG. 11A. Accordingly, the layout pattern has the same continuity (regularity) as that in the region S0.

Moreover, as shown in FIG. 11B, in the region S2, the layout pattern including the diffusion layer DN11 in the memory cell MC2 adjacent to the mediating cell DC and the layout pattern including the diffusion layer DN13 in the mediating cell DC adjacent to the memory cell MC2 are designed so as to have the same shape, to be symmetry with a cell boundary (the boundary between the memory cell MC2 and mediating cell DC), and to have a predetermined positional relations. Here, the predetermined positional relation is a positional relation in the region S2 where the continuity of a mask pattern existing in the memory cell MC1 region and in the memory cell MC2 region does not lost. That is, the positional relation is that where manufacturing conditions of the etching, CMP, film formation, and the like in the memory cell MC1 region and the memory cell MC2 region are not varied even when the region S2 exists, that is, where the manufacturing variation due to the discontinuity of the mask pattern is not generated. For example, the relation means that in the memory cell MC1 region, (the region S1), the mediating cell DC, (the region S2), and the memory cell MC2 region, which are arranged in line, the wiring line density is substantially the same and its variation is small in any part (within an area of approximately one cell), and the positional relation between the memory cell MC2 and the mediating cell DC in the region S2 (for example; the STI isolation dimension, the polysilicon distance, and the contact position) is substantially the same as the positional relation between the adjacent memory cells MC2. On this occasion, in the adjacent memory cell MC2 and mediating cell DC, shapes of facing parts are symmetry with the boundary of the cell. The configuration is the same as that of the region S0 shown in FIG. 11A. Accordingly, the layout pattern has the same continuity (regularity) as that in the region S0.

In addition, the mediating cell DC has a configuration where the Nwell region is removed and the Pwells are combined each other in the memory cell (the SRAM cell 30). On this occasion, the mediating cell DC is symmetry with a center line C of the cell other than that the arrangement of the second via for connecting the word lines WLA and WLB in the third wiring layer to the gate of the access transistor is different. The configuration can be seen as the substantially same layout pattern as that in the region S0 shown in FIG. 11A. Accordingly, the layout pattern has the same continuity (regularity) of the pattern as that in the region S0 where the memory cells MC1 and MC2 are continuously arranged Accordingly, the adjacent part of the memory cell MC1 (the SRAM cell 30), the mediating cell DC (the mediating cell 10), and the adjacent part of the memory cell MC2 (the SRAM cell 30) have the above-mentioned layout pattern and the predetermined positional relation, and thus the layout pattern has the continuity and has the same regularity. That is, the continuity of the layout pattern of the memory cell MC1 region, (the region S1), the mediating cell DC, (the region S2), and the memory cell MC2 region is the equivalent to the continuity of the layout patterns where the memory cells MC2 are adjacent to each other and where the memory cells MC1 are adjacent to each other. Accordingly, when the mediating cells 10 for changing word line (DC) are arranged, even if the same manufacturing process as that of the case where the mediating cell 10 is not arranged is employed, the SRAM 1 can be manufactured without influencing the transistor variations of the SRAM cells 30 (the memory cells MC1 and MC2). In addition, even when the black border part 100 where the mediating cell DC exists between the memory cell MC1 region and the memory cell MC2 region and the black border part 110 that is the memory cell MC2 region not including the mediating cell DC exist together, the continuity of the layout pattern is not influenced. When the SRAM 1 is used, the word line WLA and the word line WLB can be switched, maintaining the continuity of the layout pattern, and thus the power consumption due to the charging and discharging of the bit line pair can be suppressed.

Meanwhile, the distance A (the STI isolation distance) between the layout pattern including the diffusion layer DN12 and the layout pattern including the diffusion layer DN13 in the mediating cell DC itself scarcely influences the transistor variation of the memory cell. This is because the adjacent part (the part close to the diffusion layer) of the mediating cell also serves as the peripheral dummy cell. Accordingly, the above-mentioned distance A is not specifically limited; however, considering the continuity of the layout pattern, it is preferred that the distance A is substantially the same as the distances (a, b, and c) of the adjacent parts of the both cells in the case of arranging the memory cells MC1 and MC2 in line (FIG. 11A).

Figure 12A:
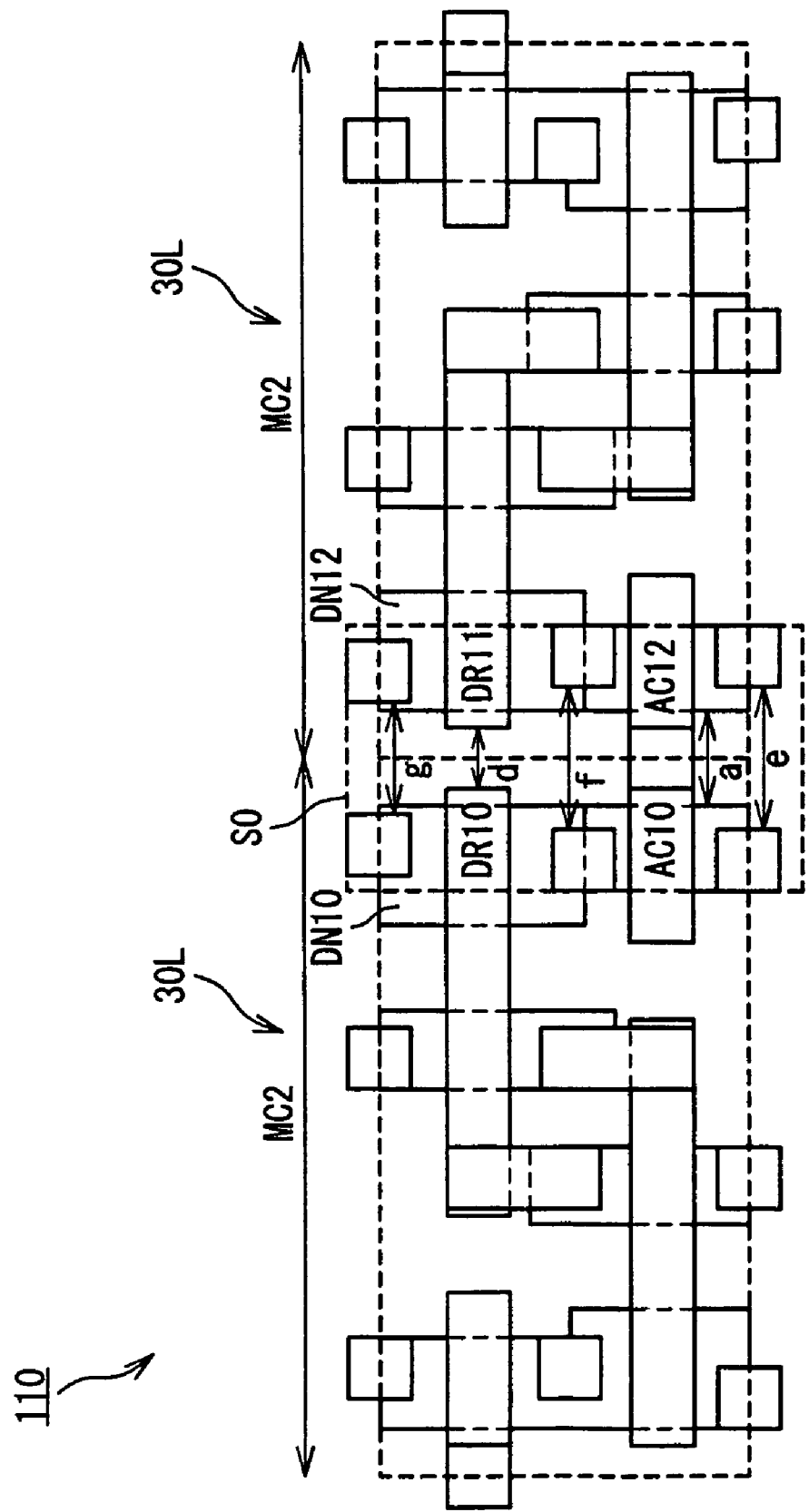
FIG. 12A is a plane view showing another example of the base layout of the black boarder part of FIG. 9A.
Figure 12B:
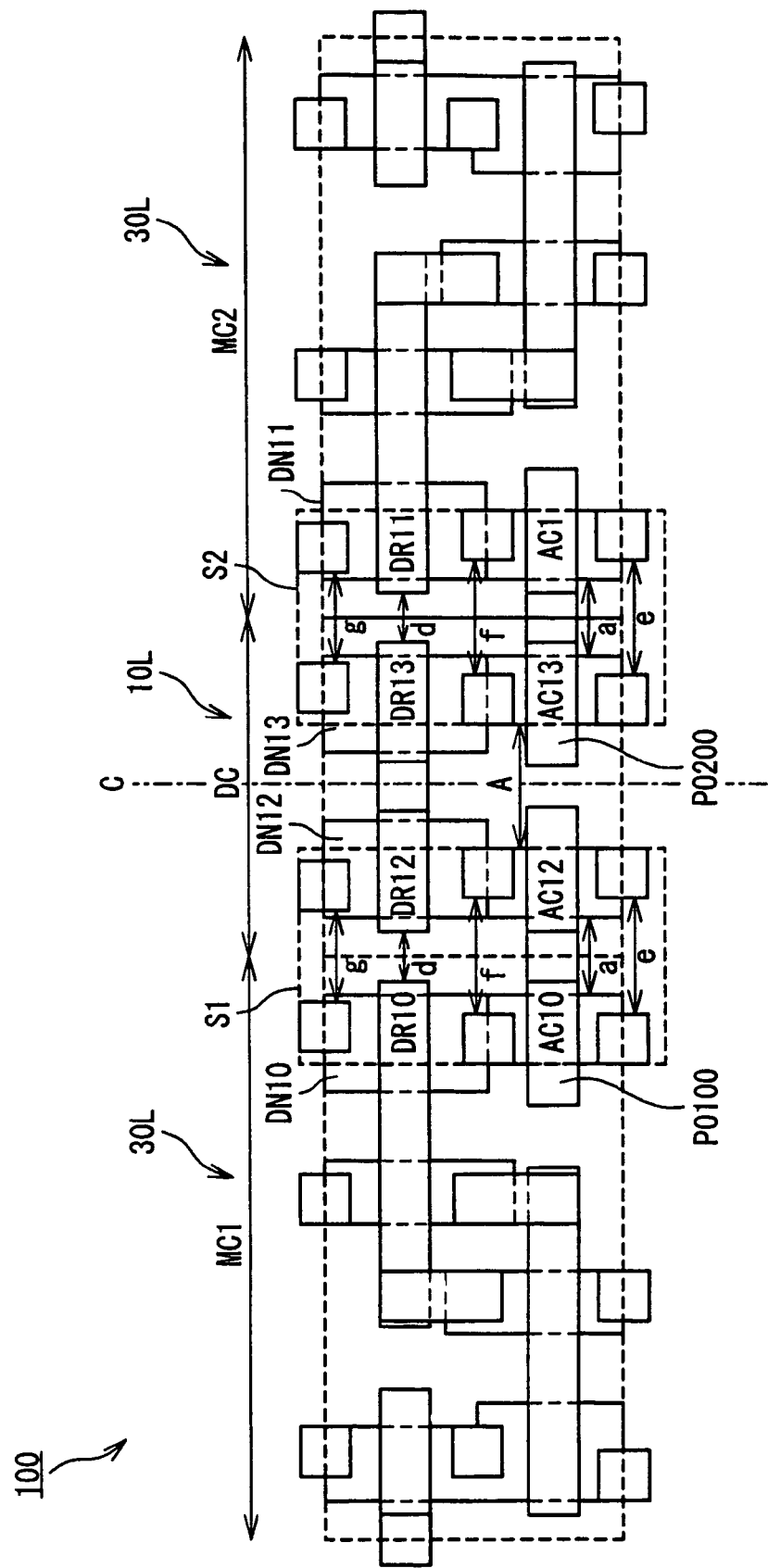
FIG. 12B is a plane view showing another example of the base layout of the black boarder part of FIG. 9A.

FIGS. 12A and 12B are plane views showing another example of the base layouts of the black border part 110 and the black border part 100 of FIG. 9A. FIGS. 12A and 12B are shown to compare the base layout of the black border part 110 (FIG. 12A) with the base layout of the black border part 100 (FIG. 12B). Here, the black border part 110 (FIG. 12A) is a region where the memory cells MC2 of the same type are arranged in line. Compared to the region where the memory cells MC1 of the same type are arranged in line, this is substantially the same other than that the arrangement of the second via is different. That is, the black border part 110 (FIG. 12A) shows a state in the region where the SRAM cells (FIG. 3A to FIG. 3C) are arranged in line, exemplifying the memory cell MC2.

As understood by comparing FIG. 12A with FIG. 12B, also in this case, in the arrangement of FIG. 12A where the right-side memory cell MC2 and the left-side memory cell MC2 that are in the Y-mirror arrangement are adjacent with each other and in the arrangement of FIG. 12B where the mediating cell DC for changing word line is provided between the memory cells MC1 and MC2, the region S0, the region S1, and the region S2, each of which is surrounded by a broken line, have the substantially same configuration. Specifically, in the region S0, the region S1, and the region S2, dimensions of a transistor gate length, STI (Shallow Trench Isolation) isolation dimensions a, a polysilicon distance d, and contact positions e, f, and g are the same.

Also in this case, in the same manner as that of the above-mentioned case, in the adjacent part of the memory cell MC1 (the SRAM cell 30), the mediating cell DC (the mediating cell 10), and the adjacent part of the memory cell MC2 (the SRAM cell 30), the layout pattern has the continuity and has the same regularity. On this occasion, in the adjacent memory cell MC1 and mediating cell DC, shapes of facing parts are symmetry with the boundary of the cell other than that the arrangement of the second via for connecting the word lines WLA and WLB in the third wiring layer to the gate of the access transistor is different. In the adjacent memory cell MC2 and mediating cell DC, similarly, shapes of facing parts are symmetry with the boundary of the cell. In addition, the mediating cell DC is symmetry with the center line C of the cell other than that the arrangement of the second via for connecting the word lines WLA and WLB in the third wiring layer to the gate of the access transistor is different. Accordingly, since the above-mentioned layout pattern in included, the SRAM 1 can be manufactured without influencing the transistor variations of the SRAM cells 30 (the memory cells MC1 and MC2). When the SRAM 1 is used, the word line WLA and the word line WLB can be switched, and thus the power consumption due to the charging and discharging of the bit line pair can be suppressed.

Here, there is a difference between: FIGS. 12A and 12B; and 11A and 11B in that the shapes of the diffusion layers DN10, DN11, DN12, and DN13 of the nMOS are different. The STI isolation distance A of the mediating cell (DC) for changing word line scarcely influences the transistor variation of the memory cell. For this reason, the nMOS driver transistors DR12 and DR13 of the mediating cell for changing word line are not necessarily required to have the same gate width as those of the nMOS driver transistors DR10 and DR11. In the case of the such configured memory cell layout, an X size of the mediating cell for changing word line can be reduced by narrowing the gate width of the mediating cell for changing word line (FIG. 12B). Meanwhile, the gate width of the driver transistor is generally larger than that of the access transistor; however, in the case of not larger, the gate width of the access transistor of the mediating cell for changing word line can be reduced.

Figure 13:
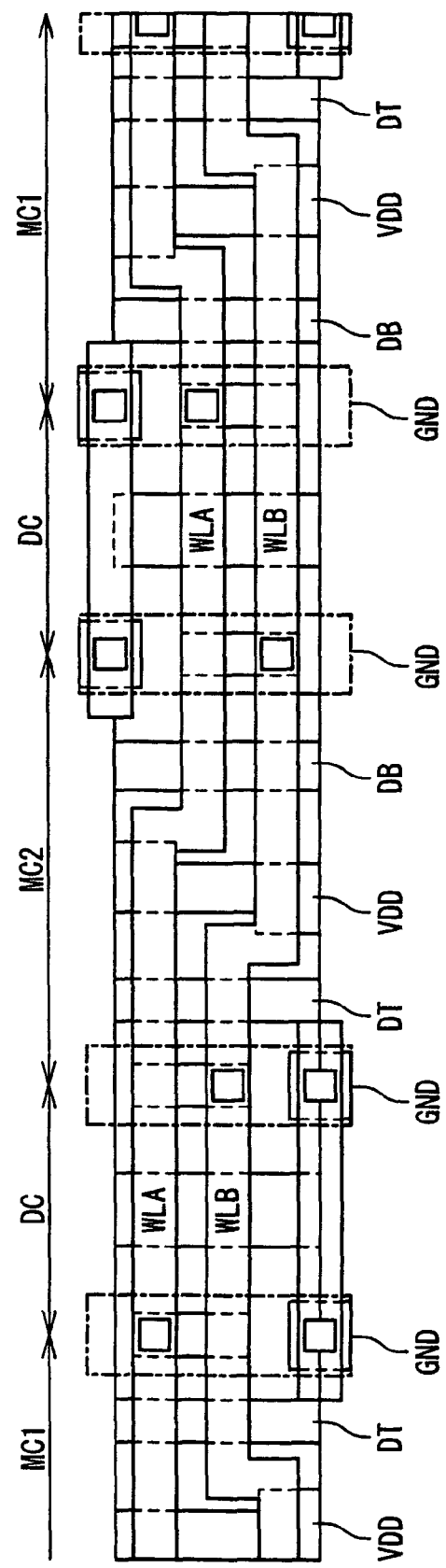
FIG. 13 is a plane view showing further another example of the layout of the semiconductor memory device according to the embodiment of the present invention.

FIG. 13 is a plane view showing further another example of the layout of the semiconductor memory device according to the embodiment of the present invention. Here, FIG. 13 shows the top layout and omits the base layout. Specifically, the memory cell MC1 has the top layout shown in FIG. 33 and the bottom layout shown in FIG. 3A. However, the layouts are turned at 180 degrees. The memory cell MC2 has the top layout shown in FIG. 3C and the bottom layout shown in FIG. 3A. However, the layouts are turned at 180 degrees. The mediating cell DC has the top layout shown in FIG. 5B and the base layout shown in FIG. 5A. However, the layouts are inverted at 180 degrees in accordance with the arrangements of the adjacent memory cells MC1 and MC2. In the example of this drawings, the case where the memory cells MC1 and MC2 are sequentially arranged in series alternately while sandwiching the mediating cell DC such as in the order of MC1, DC, MC2, DC, MC1, . . . , is shown. In this manner, also in the case where MC1, DC, MC2 are sequentially arranged in one line, the mediating cell DC is arranged on the boundary between the memory cells MC1 and MC2, and thus the memory cells MC1 and MC2 is enabled to use different word lines WLA and WLB respectively.

As described in the above-mentioned embodiment, in the semiconductor memory device that forms the mediating cell for changing word line on the memory cell, the power consumption of the cell array can be reduced without deteriorating the productivity. That is, by employing the technique for selecting word line of the cell array, the power consumption due to the charging and discharging of bit line can be suppressed without generating: the patterning deterioration of the memory cell; and increase of the transistor variations.

Figure 14:
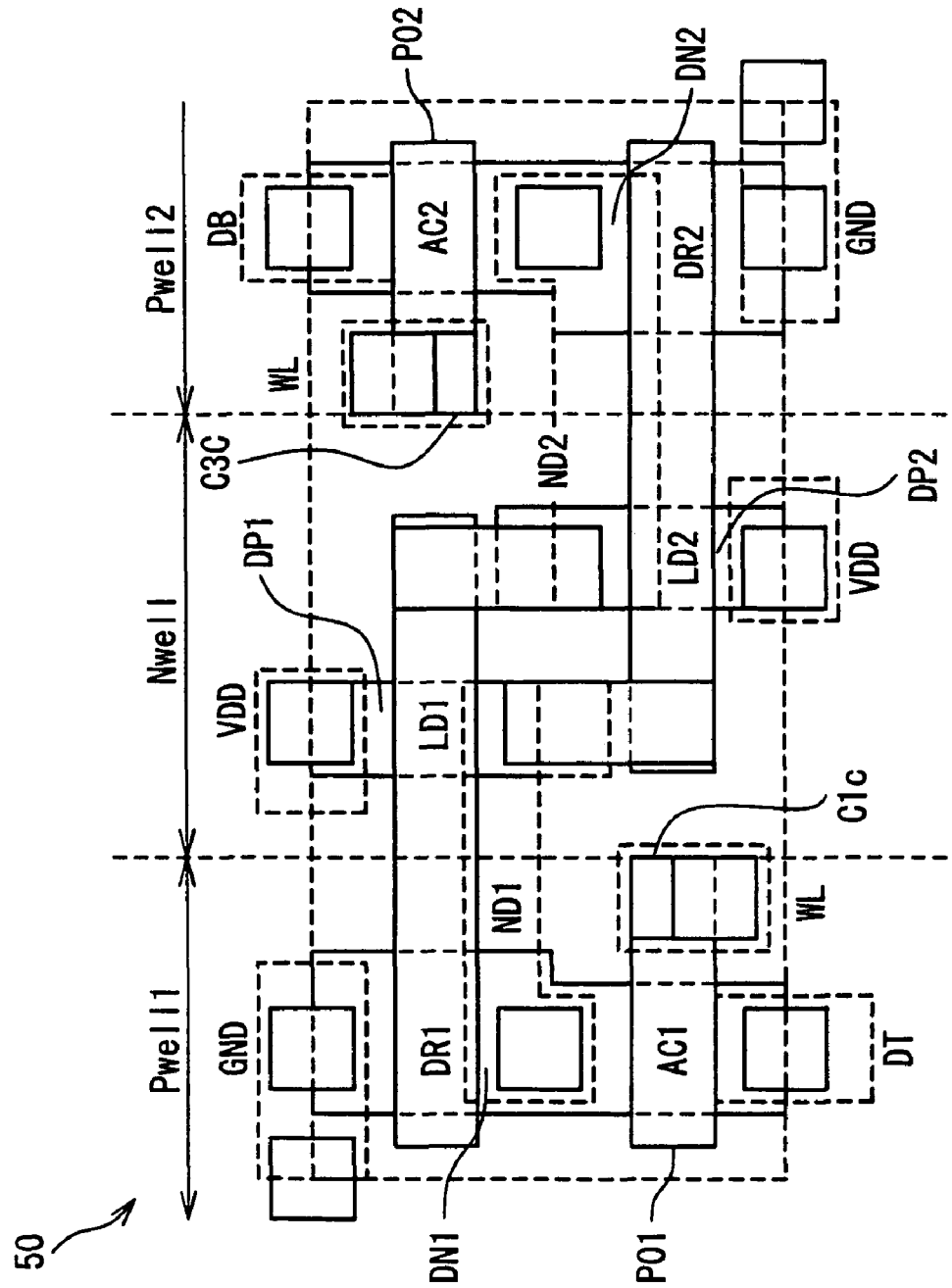
FIG. 14 shows a layout example of an SRAM cell in which a mediating cell for switching word lines is not required.

As shown in FIG. 9A, compared to the conventional case of FIG. 9B, the memory cell array area according to the present embodiment increases by a region where the mediating cells for changing word line are arranged. FIG. 14 shows a layout example of the SRAM cell that does not require the arrangement of the mediating cell for changing word line, which is created by the inventor. The SRAM cell of FIG. 14 is different from the SRAM cells of FIG. 3A to FIG. 3C in that the polysilicons PO1 and PO2 and the contacts C1c and C3c on the polysilicons of the nMOS access transistors AC1 and AC2 are not shared with the adjacent memory cell. Accordingly, if employing the layout of the SRAM cell of FIG. 14, it is not required to arrange the mediating cells for changing word line, and additionally the word lines can be switched only by the connection of the top layout. However, in the layout of the SRAM cell of FIG. 14, the gate contact of the access transistor AC is moved to a PN isolation side, and thus the arrangement is changed. Accordingly, a process margin to the gate contact is newly ensured at the moved arrangement position, and consequently the cell area is larger than the cell areas of the SRAM cells of FIGS. 3A to 3C. Then, a relation between: the existence or nonexistence of the arrangement of the mediating cell for changing word line; and the area of the memory cell array will be considered below.

Figure 15:
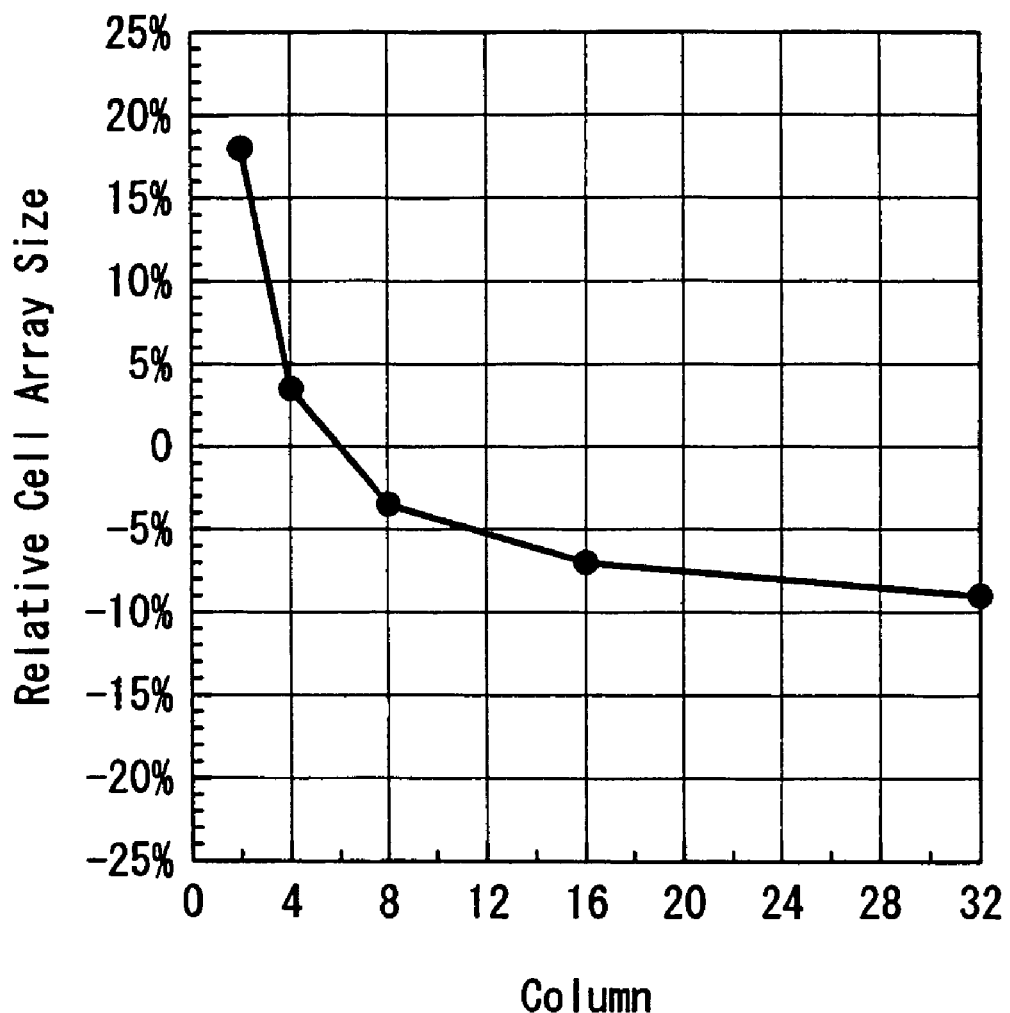
FIG. 15 is a graph drawn by plotting an area ratio between P and Q on the basis of a difference of a column configuration.

The cell array area according to the present embodiment where the mediating cells for changing word line of FIGS. 5A and 5B are arranged in the SRAM cells of FIGS. 3A to 3C is assumed to be "P", and the cell array area of the SRAM cell of FIG. 14 that does not require the mediating cell for changing word line is assumed to be "Q". FIG. 15 is a graph plotting an area ratio "((P−Q)/Q)" between "P" and "Q" on the basis of a difference of the column configuration. A horizontal axis indicates the number of columns connected to a single IO, and a vertical direction indicates the area ratio (%). As understood from FIG. 15, in the case of the memory cell array having equal to or more than eight columns, the area of the memory cell array arranging the mediating cells can be smaller than that of the memory cell array using the layout shown in FIG. 14. However, in the case of the memory cell array having equal to or less than four columns, the area of the memory cell array using the layout shown in FIG. 14 is smaller than that of the memory cell array arranging the mediating cells. As described above, the area merit cannot be obtained when the number of columns is small; however, the area merit can be obtained in the medium and large columns of eight columns or more. Generally, the larger the memory array is, the more the power consumption of the memory cell array influences a chip. Accordingly it can be considered that the area merit in the medium and large column region is large.

Moreover, the layout according to the embodiment where the mediating cells for changing word line of FIGS. 5A and 5B are arranged in the SRAM cells of FIGS. 3A to 3C is scarcely changed from the layout of the SRAM cell. In addition, it is considered that since the continuity and the regularity are maintained between the mediating cell and the layout of the SRAM cell, the mediating cell to be inserted scarcely requires additional inspection and the like for the manufacturing yield and the reliability. Meanwhile, in the case where the above-mentioned layout of the SRAM cell of FIG. 14 is employed, since a basic structure of the SRAM cell is changed, the additional inspection and the like for the manufacturing yield and the reliability are required concerning the change of design, and accordingly it takes costs, time, and efforts. As described above, the layout according to the embodiment has a merit other than the area merit in that the manufacturing yield and the reliability can be easily maintained.

In the case of the semiconductor memory device, it is commonly known that the yield is lowered due to the change of the layout pattern. Specifically, it is known that when the diffusion layer shape, the gate shape, and the contact arrangement position are changed, the transistor performance varies and a probability of error occurrence becomes high. When the diffusion layer shape varies, the transistor performance will be varied due to the influence of STI stress as the result of changing of the STI isolation width. In addition, when arrangement circumstances of the gate are changed, a manufacturing accuracy of the gate length is influenced and SiN stress on the gate is influenced. When the regularity of the contact arrangement is damaged, a size difference of a contact opening diameter occurs due to the optical proximity effect, and thus a connection defect and a short-circuit defect will occur. Accordingly, in the case where the cell for changing adjacent word lines is arranged in the memory cell, the pattern of the memory cell is required to be considered.

In addition, the continuity of the layout pattern can be considered as follows. In the semiconductor memory device, many memory cells are arranged two-dimensionally in the same layout pattern, and accordingly the defect is hard to be generated in a part where the same layout pattern is continued. However, since the continuity of the same layout pattern is stopped in the periphery portion of the arrangement of the memory cell, the defect is generated here to deteriorate the yield. Then, in order to achieve the high integration and good yield of the semiconductor memory device, as disclosed in JP-A-Showa 61-214559, recently, dummy cells that are not actually used are formed in the same layout pattern in the periphery portion of the arrangement of the memory cells. The continuity of the layout pattern is required not only in the periphery of the memory cell array, buy also on a boundary between blocks of the cell array.

The nMOS transistor of the mediating cell for changing word line arranged in the memory cell array according to the present embodiment is the same nMOS transistor as the memory cell. In the case where the memory cell is adjacent to the mediating cell, the STI width, the polysilicon arrangement, and the contact arrangement are determined so as to realize the same condition of the case where the memory cells are adjacent to each other. In this manner, surrounding circumstances of the memory cell become the same condition as those of the case where the memory cells are adjacent to each other. Accordingly, even if the mediating cell for changing word line is arranged so as to be adjacent to the memory cell, the continuity of the memory cell is not damaged, and thus the productivity is not deteriorated. Accordingly, according to the present invention, by employing the technique for selecting word line of the cell array, the power consumption due to the charging and discharging of bit line can be suppressed without generating: the patterning deterioration of the memory cell; and increase of the transistor variations.

Meanwhile, the present embodiment is described by using the SRAM cells of FIGS. 3A to 3C, that is, the SRAM cell (so-called horizontal memory cell) where the Pwell and Nwell are extended in the vertical direction, the gate polysilicon is extended in the horizontal direction, the diffusion layer is extended in the vertical direction, and the well is isolated in two positions. However, the present invention is not limited to the case of the SRAM cell. The present invention can be applied to the SRAM that shares at least the word line contact with the adjacent SRAM cell, regardless of: the directions of the Pwell and the Nwell; the direction of gate polysilicon; the direction of the diffusion layer; and the number of isolation positions of the well.

It is apparent that the present invention is not limited to the above embodiment, but may be modified and changed without departing from the scope and spirit of the invention.

Although the present invention has been described above in connection with several exemplary embodiments thereof, it would be apparent to those skilled in the art that those exemplary embodiments are provided solely for illustrating the present invention, and should not be relied upon to construe the appended claims in a limiting sense.

What is claimed is:

1. A semiconductor memory device comprising:
   a first word line and a second word line;
   a plurality of first SRAM cells, each configured to include said first word line and said second word line and be connected to said first word line;
   a plurality of second SRAM cells, each configured to include said first word line and said second word line and to be connected to said second word line; and
   a mediating cell configured to be arranged between and adjacent to one of said plurality of first SRAM cells and one of said plurality of second SRAM cells and to be connected to said first word line and said second word line,
   wherein, in said mediating cell and said plurality of first SRAM cells, cells adjacent to each other share a first contact for said first word line, and
   wherein, in said mediating cell and said plurality of second SRAM cells, cells adjacent to each other share a second contact for said second word line.

2. The semiconductor memory device according to claim 1, wherein said mediating cell includes:
   a first access transistor configured to be connected to a first contact for said first word line shared with adjacent one of said plurality of first SRAM cells at a gate and be connected to a first power source at a source and a drain, and
   a second access transistor configured to be connected to a second contact for said second word line shared with adjacent one of said plurality of second SRAM cells at a gate and be connected to said first power source at a source and a drain.

3. The semiconductor memory device according to claim 2, wherein a gate of an access transistor of said adjacent one of said plurality of first SRAM cells and said gate of said first access transistor of said mediating cell are in common, and
   wherein a gate of an access transistor of said adjacent one of said plurality of second SRAM cells and said gate of said second access transistor of said mediating cell are in common.

4. The semiconductor memory device according to claim 2, wherein said mediating cell includes:
   a first drive transistor configured to be connected to said first power source at a gate, a source and a drain, and
   a second drive transistor configured to be connected to said first power source at a gate, a source and a drain,
   wherein a shape of a first part where said mediating cell and said adjacent one of said plurality of first SRAM cells face to each other is symmetrical with respect to a boundary line between said mediating cell and said adjacent one first SRAM cell, and
   wherein a shape of a second part where said mediating cell and said adjacent one of said plurality of second SRAM cells face to each other is symmetrical with respect to a boundary line between said mediating cell and said adjacent one second SRAM cell.

5. The semiconductor memory device according to claim 4, wherein said shape of said first part is substantially the same as a shape of a part where adjacent two of said plurality of first SRAM cells face to each other, and
   wherein said shape of said second part is substantially the same as a shape of a part where adjacent two of said plurality of second SRAM cells face to each other.

6. The semiconductor memory device according to claim 2, wherein a shape of said mediating cell except for a via connected to said first word line and a via connected to said second word line is symmetrical with respect to a center line of said mediating cell, which is parallel to a boundary line between said mediating cell and one of said plurality of first SRAM cells or one of said plurality of second SRAM cells.

7. The semiconductor memory device according to claim 2, wherein dimensions of access transistors and driver transistors of said mediating cell are substantially the same as dimensions of access transistors and driver transistors of each of said plurality of first SRAM cells and each of said plurality of second SRAM cells.

8. The semiconductor memory device according to claim 2, wherein said mediating cell is formed only in a single well of a first conductive type, and
  wherein said well has a continuity with a well of said first conductive type in said adjacent one of said plurality of first SRAM cells and a well of said first conductive type in said adjacent one of said plurality of second SRAM cells.

9. The semiconductor memory device according to claim 2, wherein a shape of each of said plurality of first SRAM cells except for a via connected to said first word line is substantially the same as a mirror revered shape of each of said plurality of second SRAM cells except for a via connected to said second word line.

10. The semiconductor memory device according to claim 4, wherein a shape of said mediating cell except for a via connected to said first word line and a via connected to said second word line is symmetrical with respect to a center line of said mediating cell, which is parallel to a boundary line between said mediating cell and one of said plurality of first SRAM cells or one of said plurality of second SRAM cells.

11. The semiconductor memory device according to claim 4, wherein dimensions of access transistors and driver transistors of said mediating cell are substantially the same as dimensions of access transistors and driver transistors of each of said plurality of first SRAM cells and each of said plurality of second SRAM cells.

12. The semiconductor memory device according to claim 4, wherein said mediating cell is formed only in a single well of a first conductive type, and
  wherein said well has a continuity with a well of said first conductive type in said adjacent one of said plurality of first SRAM cells and a well of said first conductive type in said adjacent one of said plurality of second SRAM cells.

13. The semiconductor memory device according to claim 4, wherein a shape of each of said plurality of first SRAM cells except for a via connected to said first word line is substantially the same as a mirror revered shape of each of said plurality of second SRAM cells except for a via connected to said second word line.

14. The semiconductor memory device according to claim 10, wherein dimensions of access transistors and driver transistors of said mediating cell are substantially the same as dimensions of access transistors and driver transistors of each of said plurality of first SRAM cells and each of said plurality of second SRAM cells.

15. The semiconductor memory device according to claim 14, wherein said mediating cell is formed only in a single well of a first conductive type, and
  wherein said well has a continuity with a well of said first conductive type in said adjacent one of said plurality of first SRAM cells and a well of said first conductive type in said adjacent one of said plurality of second SRAM cells.

16. The semiconductor memory device according to claim 15, wherein a shape of each of said plurality of first SRAM cells except for a via connected to said first word line is substantially the same as a mirror revered shape of each of said plurality of second SRAM cells except for a via connected to said second word line.

* * * * *